United States Patent [19]

Hutchison

[11] 3,836,709

[45] Sept. 17, 1974

[54] PROCESS AND APPARATUS FOR PREPARING PRINTING PLATES USING A PHOTOCURED IMAGE

[75] Inventor: John Grear Hutchison, Catonsville, Md.

[73] Assignee: W. R. Grace & Co., New York, N.Y.

[22] Filed: Apr. 12, 1972

[21] Appl. No.: 243,388

[52] U.S. Cl. .................... 178/6.7 R, 96/33, 96/36.3, 178/6.6 B

[51] Int. Cl. ............................ G03f 1/02, H04n 1/28

[58] Field of Search ........... 178/6.6 R, 6.6 B, 6.7 R; 96/115 P, 33, 48 HD, 35.1, 36.3

[56] References Cited

UNITED STATES PATENTS

| | | | |
|---|---|---|---|
| 3,246,079 | 4/1966 | Teucher | 178/6.6 B |
| 3,506,779 | 4/1970 | Brown et al. | 178/6.6 B |
| 3,615,448 | 10/1971 | Yeshin | 96/33 |
| 3,636,251 | 1/1972 | Daly | 178/6.6 B |

*Primary Examiner*—Raymond F. Cardillo, Jr.
*Attorney, Agent, or Firm*—Elton Fisher; L. G. Wise; K. E. Prince

[57] ABSTRACT

A printing plate is prepared by subjecting a uniform coating of the photocurable composition on a support layer to a beam of laser radiation, varying in a controlled manner the point at which the laser beam impinges on the coating so that a predetermined pattern of cured photocurable composition is formed, and thereafter removing the uncured portions of the photocurable composition.

22 Claims, 7 Drawing Figures

PROCESS AND APPARATUS FOR PREPARING PRINTING PLATES USING A PHOTOCURED IMAGE

BACKGROUND OF THE INVENTION

In the printing industry, polymeric printing plates offer advantages over cast metal type. A photographic negative is prepared from a "paste-up" of the full size document to be reproduced. This photographic negative is then used to prepared the polymeric printing plate. Exposure through the negative with actinic radiation generates the desired image.

This invention relates to apparatus and a process for preparing a polymeric printing plate from a plate comprising a uniform coating of photocurable composition on a support layer. The printing plate is prepared by curing (photoinsolubilized) selected portions of a substantially uniform coating of the photocurable composition on the support layer (a plate, or substrate) by exposing selected portions of the photocurable composition to actinic ratiation--scanned laser beam--for a sufficient time to insolubolize the exposed portions of the photocurable composition and thereafter removing the uncured portions of the photocurable composition.

An advantage of this invention is that the production of the photographic negative, which is an expensive and time consuming process, is no longer required. An additional advantage of this invention is that the scanned laser beam is readily amenable to computer control and therefore lends itself to computer composition of alphanumeric/graphic characters.

The apparatus and process for focusing, modulating and deflecting the actinic laser beam is capable of great speed and precision. Furthermore, the printing plate that is being prepared does not require mechanical translation or rotation to produce the image. Similarly the laser itself need not be mechanically translated. The laser beam is deflected and modulated in a controlled manner by using electro-optic or acousto-optic components or rotating or oscillating mirrors.

Exposing the uniform coating of photocurable composition to the laser beam of actinic radiation can be accomplished by; (a) subjecting the coating of photocurable composition to a focused beam of coherent radiation emerging from a laser having an intensity sufficient to cure said photocurable composition, varying in a controlled manner, the point at which the laser beam impinges upon the coating of photocurable composition so that a predetermined pattern of cured photocurable composition is formed while controlling the intensity of the impinging laser beam in such manner that the extent of the cured portions can be varied; and (b) modulating the amplitude of a laser beam in accordance with an electrical signal representative of the information to be printed, producing a focused spot to perform a recording scan of the surface of the coating of photocurable composition--the focused spot curing the scanned areas of the photocurable composition.

U.S. Pat. No. 3,615,450 (Werber et al. 96/35.1) and U.S. Pat. No. 3,537,853 (Wessells et al., 96/351) teach methods for preparing printing plates from photocurable compositions. Said patents are incorporated herein by reference.

U.S. Pat. No. 3,549,733 (Caddell, 264/25) teaches a method for preparing polymeric rotogravure (intaglio) printing plates using a laser beam to form depressions in a polymeric plate, and U.S. Pat. No. 3,389,403 (Cottingham et al., 346/108) teaches the use of a laser beam recorder adapted to record computer data. Said patents are incorporated herein by reference.

U.S. Pat. No. 3,465,347 (Hudson 364/1), U.S. Pat. No. 3,475,760 (Carlson 346/1) and U.S. Pat. No. 3,465,352 (carlson et al., 347/76) teach the use of a laser beam to record data. Said patents are also incorporated herein by reference.

Datawrite Bulletin, "A Laser Recorder for Business Machine Application," Datawrite, Incorporated, 77 Dudley Tower Road, Bloomfield, Connecticut 06002, teaches the use of a laser beam for such applications as computer output microfilm production, phototypesetting, and non-impact printing.

SUMMARY OF THE INVENTION

In summary this invention is directed to an apparatus useful for preparing a photoinsolubilized photocured printing plate from a plate comprising a support layer and a photocurable composition coated on and supported by the support layer, the apparatus comprising:

a. a laser adapted to generate a beam of actinic laser radiation;

b. a modulator positioned to receive and modulate the beam of actinic laser radiation;

c. a means for orienting the modulated beam of actinic laser radiation positioned to receive and orient the modulated beam of actinic laser radiation, the means for orienting the modulated beam of actinic laser radiation comprising a vertical sweep deflector and a horizontal sweep deflector;

d. a means for focusing the oriented and modulated beam of actinic laser radiation positioned to receive the oriented and modulated beam of actinic laser radiation and focus it on a predetermined plane;

e. a partially reflecting mirror (beamsplitter) interposed between the means for focusing the oriented and modulated beam of actinic laser radiation and the predetermined plane positioned to divide the focused, oriented, and modulated beam of actinic laser radiation into;

i. a major beam of focused, oriented, and modulated actinic laser radiation focused on the predetermined plane; and ii. a minor beam of oriented and modulated actinic laser radiation deflected from the path of the major focused, oriented, and modulated beam of actinic laser radiation;

f. a first support positioned to hold the plate comprising the photocurable composition and the support layer with the photocurable composition in the predetermined plane;

g. a second support positioned to hold a first transparency in and substantially perpendicular to the path of the minor beam of oriented and modulated actinic laser radiation so that the minor beam of oriented and modulated actinic laser radiation can pass through transparent portions of the transparency;

h. a photomultiplier tube positioned to receive the minor beam of oriented and modulated actinic laser radiation which has passed through the transparency and emit a first electrical signal in response to the minor beam of oriented and modulated actinic laser radiation which has passed through the transparency;

i. a first amplifier positioned to receive the first electrical signal from the photomultiplier tube and emit a second amplified electrical signal in response to the first electrical signal, the second amplified electrical signal passing to and controlling the modulator;

j. a master clock to emit a third electrical signal and a fourth electrical signal;

k. a vertical sweep generator positioned to receive the third electrical signal from the master clock and emit a fifth electrical signal in response to the third electrical signal;

l. a second amplifier positioned to receive the fifth electrical signal and emit a sixth amplified electrical signal in response to the fifth electrical signal, the sixth amplified electrical signal passing to and controlling the vertical sweep deflector;

m. a horizontal sweep generator positioned to receive the fourth electrical signal from the master clock and emit a seventh electrical signal in response to the fourth electrical signal;

n. a third amplifier positioned to receive the seventh electrical signal and emit an eighth amplified electrical signal in response to the seventh electrical signal, the eighth amplified electrical signal passing to and controlling the horizontal sweep deflector;

DESCRIPTION OF PREFERRED EMBODIMENTS

Figure 1:
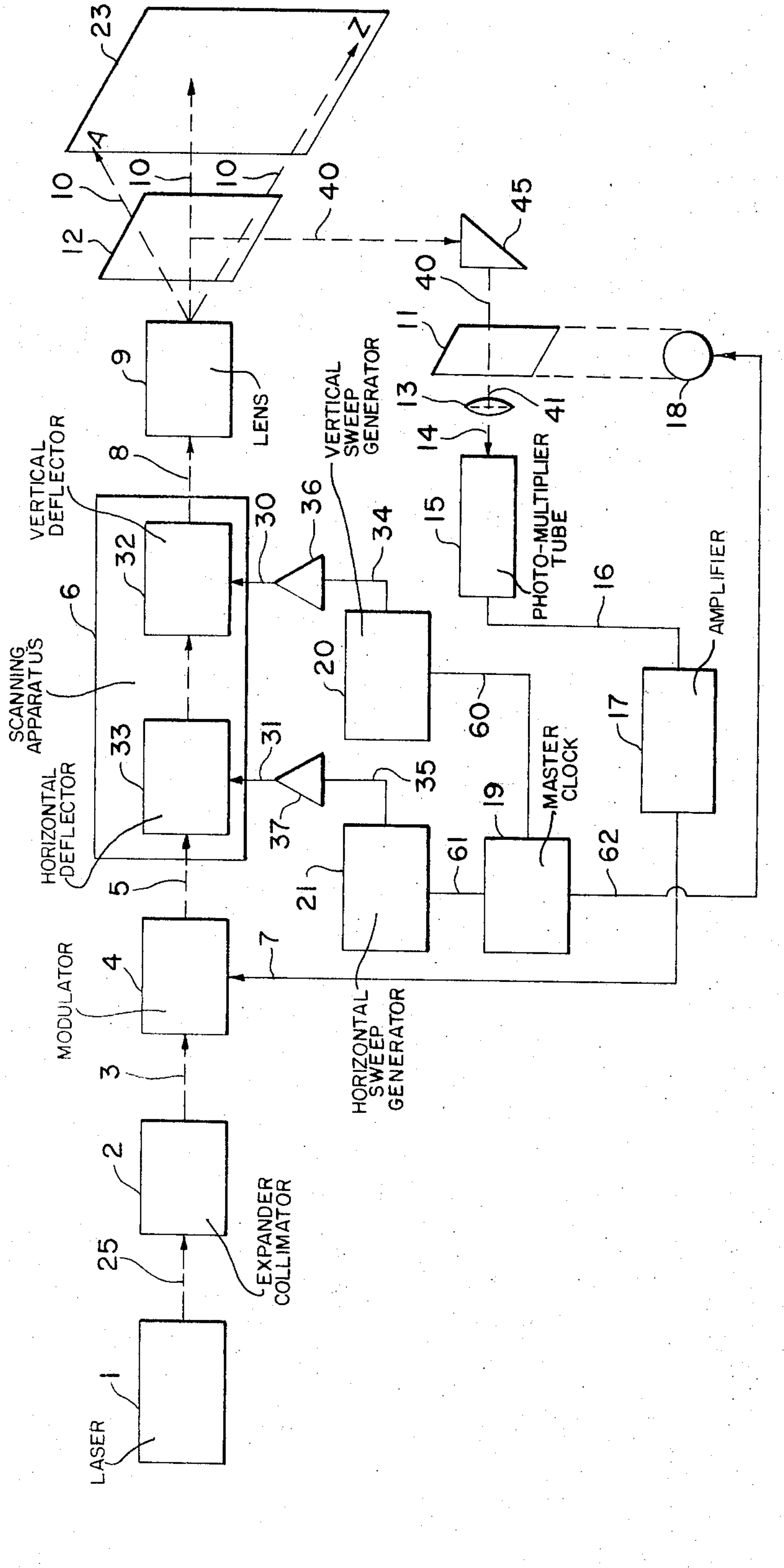
FIG. 1 is a schematic diagram of one possible embodiment of an apparatus that can be used to produce a printing plate.

In preferred embodiments of the embodiment set forth in the above summary:

1. A collimator and beam expander is positioned between the laser and the modulator to receive, collimate, and expand the beam of actinic radiation generated by the laser.

2. A lens system is positioned to receive the minor beam of oriented and modulated actinic laser radiation which has passed through the transparency and focus it on the photomultiplier tube.

3. The first amplifier is a video amplifier.

4. The master clock emits a ninth electrical signal, the ninth electricaion signal passing to and activating a means for transporting the first transparency and a second transparency to position the second transparency substantially perpendicular to the minor beam of oriented and modulated actinic laser radiation so that the minor beam can pass through transparent portions of the transparency.

5. The laser can be an argon ion, a krypton ion laser, a pulsed nitrogen laser, or a helium-cadmium laser.

In another preferred embodiment ("Embodiment A") this invention is directed to a process for preparing a polymeric printing plate from a plate comprising a coating of a photocurable composition and a support layer the photocurable composition being coated on and supported by the support layer, the printing plate having an image thereon corresponding to an image on a transparency, the process comprising:

a. generating a beam of actinic laser radiation having an intensity sufficient to cure the photocurable composition;

b. modulating the beam of actinic laser radiation in a controlled manner;

c. orienting the beam of modulated actinic laser radiation in a controlled manner;

d. focusing the beam of oriented and modulated actinic laser radiation on a predetermined plane;

e. dividing the beam of focused, oriented, and modulated actinic laser radiation into;

i. a major beam of focused, oriented, and modulated actinic laser radiation, the major beam of focused, oriented, and modulated actinic laser radiation being focused on the coating of photocurable composition positioned in the predetermined plane to cure exposed portions of the photocurable composition; and ii. a minor beam of oriented and modulated actinic laser radiation, the minor beam of oriented and modulated laser radiation being deflected from the path of the major beam of focused, oriented, and modulated actinic laser radiation;

f. passing the minor beam of oriented and modulated actinic laser radiation through transparent portions of the transparency;

g. converting the minor beam of oriented and modulated actinic laser radiation which has passed through the transparency into a first electrical signal;

h. amplifying the first electrical signal to produce a second amplified electrical signal and passing the second amplified signal to a modulator to control the modulator, the modulator controlling modulation of the beam of actinic laser radiation;

i. passing a third electrical signal from a master clock to a vertical sweep generator, the third electrical signal controlling the vertical sweep generator and causing the vertical sweep generator to emit a fourth electrical signal;

j. amplifying the fourth electrical signal and passing the resulting fifth amplified electrical signal to a vertical sweep deflector to control the vertical sweep deflector, the vertical sweep deflector controlling a vertical sweep pattern of the beam of modulated actinic laser radiation;

k. passing a sixth electrical signal from the master clock to a horizontal sweep generator, the sixth electrical signal controlling the horizontal sweep generator and causing the horizontal sweep generator to emit a seventh electrical signal;

l. amplifying the seventh electrical signal and passing the resulting eighth amplified electrical signal to a horizontal sweep deflector to control the horizontal sweep deflector, the horizontal sweep deflector controlling a horizontal sweep pattern of the beam of modulated actinic laser radiation; and m. removing uncured portions of the photocurable composition from the support layer.

In preferred embodiments of the embodiment set forth in Embodiment A:

1. The beam of actinic laser radiation is collimated and expanded before being modulated.

2. The photocurable composition comprises a liquid polyfunctional component having molecules containing at least two reactive ethylenically or acetylenically unsaturated carbon-to-carbon bonds per molecule and a liquid polythiol component having molecules containing at least two thiol groups per molecule, with the total functionality of the polyfunctional component and the polythiol component being greater than four.

3. The laser beam has a wave length of 3,000–4,000A.

4. The photocurable composition contains a photocuring rate accelerator selected from the group consisting of an aryl aldehyde, a diaryl ketone, an alkyl aryl ketone, a triaryl phosphine, and a blend of a carbon tetrahalide with a polynuclear aromatic hydrocarbon. The amount of photocuring rate accelerator can be about 0.0005–50 percent, or 0.05–25 percent by weight of the photocurable composition.

5. The support layer is metal (e.g., aluminum, copper, or a steel-containing metal), plastic, or paper.

6. An actinic laser beam absorptive layer is intermediate the support layer and the coating of photocurable composition.

8. Photocurable composition is removed from unexposed portions of the exposed plate by washing with an aqueous medium.

9. The photocurable composition contains at least one member selected from the group consisting of a filler, a pigment, and oder mask, a light-scattering agent, a plasticizer, and an antioxidant, the weight ratio of the photocurable composition to the group member being about 1:0.00005–5. The filler can be be glass, wood flour, clay, silica, alumina, or the like.

10. The thickness of the coating of photocurable composition is about 0.1–500, 0.1–5, 5–30, or 10–500 mils.

11. The photomultiplier tube is used to convert the minor beam of oriented and modulated actinic laser radiation which has passed through the transparency into the first electric signal.

In another preferred embodiment ("Embodiment B") this invention is directed to an apparatus useful for preparing a photoinsolubilized photocured printing plate from a plate comprising a support layer and a photocurable composition coated on and supported by the support layer, the apparatus comprising:

a. a laser to generate a beam of actinic laser radiation;

b. a modulator positioned to receive and modulate the beam of actinic laser radiation;

c. a means for orienting the modulated beam of actinic laser radiation positioned to receive and orient the modulated beam of actinic laser radiation, the means for orienting the modulated beam of actinic laser radiation comprising a vertical sweep deflector and a horizontal sweep deflector;

d. a first means for focusing the oriented and modulated beam of actinic laser radiation positioned to receive the oriented and modulated beam of actinic laser radiation and focus it on a first predetermined plane;

e. a partially reflecting mirror interposed between the means for focusing the oriented and modulated beam of actinic laser radiation and the first predetermined plane positioned to divide the focused, oriented, and modulated beam of actinic laser radiation into;

i. a major beam of focused oriented and modulated actinic laser radiation focused on the first predetermined plane; and ii. a minor beam of oriented and modulated actinic laser radiation deflected from the path of the major focused, oriented, and modulated beam of actinic laser radiation;

f. a first support positioned to hold the plate comprising the photocurable composition and the support layer with the photocurable composition in the first predetermined plane;

g. a second support positioned to hold a document to be reproduced in and substantially perpendicular to the path of the minor beam of oriented and modulated actinic laser radiation so that the minor beam of oriented and modulated actinic laser radiation can impinge on and be reflected from the surface of the document to be reproduced;

h. a second means for focusing the reflected minor beam of oriented and modulated actinic laser radiation on a second predetermined plane;

i. a photomultiplier tube positioned in the second predetermined plane to receive the reflected minor beam of focused, oriented, and modulated actinic laser radiation and omit a first electrical signal in response to the beam of reflected, focused, oriented, and modulated actinic laser radiation;

j. a first amplifier positioned to receive the first electrical signal from the photomultiplier tube and emit a second amplifier electric signal in response to the first electric signal, the second amplified electrical signal passing to and controlling the modulator;

k. a master clock to emit a third electrical signal and a fourth electrical signal;

l. a vertical sweep generator positioned to receive the third electrical signal from the master clock and emit a fifth electrical signal in response to the third electrical signal;

m. a second amplifier positioned to receive the fifth electrical signal and emit a sixth amplified electrical signal in response to the fifth electrical signal, the sixth amplified electrical signal passing to and controlling the vertical sweep deflector;

n. a horizontal sweep generator positioned to receive the fourth electrical signal and emit a seventh electrical signal in response to the fourth electrical signal;

o. third amplifier positioned to receive the seventh electrical signal and emit an eighth amplified electrical signal in response to the seventh electrical signal, the eighth amplified electrical signal passing to and controlling the horizontal sweep generator.

In preferred embodiments of the embodiment set forth in Embodiment B:

1. A collimator and beam expander is positioned between the laser and the modulator to receive, collimate, and expand the beam of actinic radiation generated by the laser.

2. The first, second, and third amplifier can be video amplifiers.

3. The laser is an argon ion laser, a krypton ion laser, a pulsed nitrogen laser, or a helium-cadmium laser.

In another preferred embodiment ("Embodiment C") this invention is directed to a process for preparing a polymeric printing plate from a plate comprising a coating of a photocurable composition and a support layer, the photocurable composition being coated on and supported by the support layer, the printing plate having an image thereon corresponding to an image on a document, the process comprising;

a. generating a beam of actinic laser radiation having an intensity sufficient to cure the photocurable composition;

b. modulating the beam of actinic laser radiation in a controlled manner;

c. orienting the beam of modulated actinic laser radiation in a controlled manner;

d. focusing the beam of oriented and modulated actinic laser radiation on a predetermined plane;

e. dividing the beam of focused, oriented, and modulated actinic laser radiation into;

i. a major beam of focused, oriented, and modulated actinic laser radiation, the major beam of focused, oriented, and modulated actinic laser radiation being focused on the coating of photocurable composition positioned in the predetermined plane to cure exposed portions of the photocurable composition; and ii. a minor beam of oriented and modulated actinic laser radiation, the minor beam of oriented and modulated laser radiation being deflected from the path of major beam of focused, oriented, and modulated actinic laser radiation;

f. impinging the minor beam of oriented and modulated actinic laser radiation on the surface of the document and reflecting the minor beam of oriented and modulated actinic laser radiation from the surface;

g. converting the minor beam of oriented and modulated actinic laser radiation reflected from the document into a first electrical signal;

h. amplifying the first electrical signal to produce a second amplified electric signal and passing the second amplified signal to a modulator to control the modulator, the modulator controlling modulation of the beam of actinic laser radiation;

i. passing a third electrical signal from a master clock to a vertical sweep generator, the third electrical signal controlling the vertical sweep generator and causing the vertical sweep generator to emit a fourth electrical signal;

j. amplifying the fourth electrical signal and passing the resulting fifth amplified electrical signal to a vertical sweep deflector to control the vertical sweep deflector, the vertical sweep deflector controlling a vertical sweep pattern of the beam of modulated actinic laser radiation;

k. passing a sixth electrical signal from the master clock to a horizontal sweep generator, the sixth electrical signal controlling the horizontal sweep generator and causing the horizontal sweep generator to emit a seventh electrical signal;

l. amplifying the seventh electrical signal and passing the resulting eighth amplified electrical signal to a horizontal sweep deflector to control the horizontal sweep deflector, the horizontal sweep deflector controlling a horizontal sweep pattern of the beam of modulated actinic laser radiation; and m. removing uncured portions of the photocurable composition from the support layer.

In preferred embodiments of the embodiment set forth in Embodiment C:

1. The beam of actinic laser radiation is collimated and expanded before being modulated.

2. The photocurable composition comprises a liquid polyfunctional component having molecules containing at least two reactive ethylenically or acetylenically unsaturated carbon-to-carbon bonds per molecule and a liquid polythiol component having molecules containing at least two thiol groups per molecule, with the total functionality of the polyfunctional component and the polythiol component being greater than four.

3. The laser beam has a wave length of 3,000–4,000A.

4. The photocurable composition contains a photocuring rate accelerator selected from the group consisting of an aryl aldehyde, a diaryl ketone, an alkyl aryl ketone, a triaryl phosphine, and a blend of a carbon tetrahalide with a polynuclear aromatic hydrocarbon. The amount of photocuring rate accelerator can be about 0.0005–50 percent or about 0.05–25 percent by weight of the photocurable composition.

In another preferred embodiment ("Embodiment D") this invention is directed to an apparatus useful for preparing a photoinsolubilized photocured printing plate from a plate comprising a support layer and a photocurable composition coated on and supported by the support layer, the apparatus comprising:

a. a laser to generate a beam of actinic laser radiation;

b. a modulator positioned to receive and modulate the beam of actinic laser radiation;

c. a means for orienting the modulated beam of actinic laser radiation positioned to receive and orient the modulated beam of actinic laser radiation, the means for orienting the modulated beam of actinic laser radiation comprising a vertical sweep deflector and a horizontal sweep deflector;

d. a means for focusing the oriented and modulated beam of actinic laser radiation positioned to receive the oriented and modulated beam of actinic laser radiation and focus it on a predetermined plane;

e. a support positioned to hold the plate comprising the photocurable composition and the support layer with the photocurable composition in the predetermined plane;

f. a television vidicon tube positioned to view a document and produce a first electrical signal in response to the image on the document;
g. a first amplifier positioned to receive the first electrical signal from the television vidicon tube and convert the first electrical signal into a second amplified electric signal, the second amplified electrical signal passing to and controlling the modulator;
h. a master clock to emit a third electrical signal and a fourth electrical signal;
i. a vertical sweep generator positioned to receive the third electrical signal from the master clock and emit a fifth electrical signal in response to the third electrical signal;
j. a second amplifier positioned to receive the fifth electrical signal and emit a sixth amplified electrical signal in response to the fifth electrical signal, the sixth amplified electrical signal passing to and controlling the vertical sweep deflector;
k. a horizontal sweep generator positioned to receive the fourth electrical signal from the master clock and emit a seventh electrical signal in response to the fourth electrical signal;
l. a third amplifier positioned to receive the seventh electrical signal and emit an eighth amplified electrical signal in response to the seventh electrical signal, the eighth amplified electrical signal passing to and controlling the horizontal sweep deflector.

In preferred embodiments of the embodiment set forth in Embodiment D.

1. A collimator and beam expander is positioned between the laser and the modulator to receive, collimate, and expand the beam of actinic radiation generated by the laser.

2. The first amplifier, the second amplifier, and the third amplifier can be video amplifiers.

3. The laser is an argon ion, krypton ion laser, a pulsed nitrogen laser, or a helium cadmium laser.

In another preferred embodiment ("Embodiment E") this invention is directed to a process for preparing a polymeric printing plate from a plate comprising a coating of a photocurable composition and a support layer, the photocurable composition being coated on and supported by the support layer, the printing plate having an image thereon corresponding to an image on a document, the process comprising:

a. generating a beam of actinic laser radiation having an intensity sufficient to cure the photocurable composition;
b. modulating the beam of actinic laser radiation in a controlled manner;
c. orienting the beam of modulated actinic laser radiation in a controlled manner;
d. focusing the beam of oriented and modulated actinic laser radiation on the coating of photocurable composition to cure exposed portions of the photocurable composition;
c. using a television vidicon tube to convert the image on the document into a first electrical signal;
f. amplifying the first electrical signal to produce a second amplified electric signal and passing the second amplified signal to a modulator to control the modulator, the modulator controlling modulation of the beam of actinic laser radiation;
g. passing a third electrical signal from a master clock to a vertical sweep generator, the third electrical signal controlling the vertical sweep generator and causing the vertical sweep generator to emit a fourth electrical signal;
h. amplifying the fourth electrical signal and passing the resulting fifth amplified electrical signal to a vertical sweep deflector to control the vertical sweep deflector, the vertical sweep deflector controlling a vertical sweep pattern of the beam of modulated actinic laser radiation;
i. passing a sixth electrical signal from the master clock to a horizontal sweep generator, the sixth electrical signal controlling the horizontal sweep generator and causing the horizontal sweep generator to emit a seventh electrical signal;
j. amplifying the seventh electrical signal and passing the resulting eighth amplified electrical signal to a horizontal sweep deflector to control the horizontal sweep deflector, the horizontal sweep deflector controlling a horizontal sweep pattern of the beam of modulated actinic laser radiation; and
k. removing uncured portions of the photocurable composition from the support layer.

In preferred embodiments of the embodiment set forth in Embodiment E:

1. The beam of actinic laser radiation is collimated and expanded before being modulated.

2. The photocurable composition comprises a liquid polyfunctional component having molecules containing at least two reactive ethylenically or acetylenically unsaturated carbon-to-carbon bonds per molecule and a liquid polythiol component having molecules containing at least two thiol groups per molecule, with the total functionality of the polyfunctional component and the polythiol component being greater than four.

3. The laser beam has a wave length of 3,000–4,000A.

4. The process of claim 19 in which the photocurable composition contains a photocuring rate accelerator selected from the group consisting of an aryl aldehyde, a diaryl ketone, an alkyl aryl ketone, a triaryl phosphine, and a blend of a carbon tetrahalide with a polynuclear aromatic hydrocarbon. The photocuring rate accelerator can be about 0.0005–50 percent or 0.05–25 percent by weight of the photocurable composition.

In another embodiment ("Embodiment F") this invention is directed to and apparatus useful for preparing a photoinsolubilized photocured printing plate from a plate comprising a support layer and a photocurable composition coated on and supported by the support layer, the apparatus comprising:

a. a laser to generate a beam of actinic laser radiation;
b. a modulator positioned to receive and modulate the beam of actinic laser radiation;
c. a means for orienting the modulated beam of actinic laser radiation positioned to receive and orient the modulated beam of actinic laser radiation, the means for orienting the modulated beam of actinic laser radiation comprising a vertical sweep deflector and a horizontal sweep deflector;
e. a support positioned to hold the plate comprising the photocurable composition and the support layer with the photocurable composition in the predetermined plane;

f. a means for storing data (e.g., a magnetic tape or an equivalent storage medium (e.g., a magnetic drum, a magnetic disk, a paper tape, or the like) with data stored therein.

g. means for converting the stored data into;
  i. a first electrical signal, the first electrical signal passing to and controlling the modulator;
  ii. a second electrical signal; and
  iii. a third electrical signal;

h. a first amplifier positioned to receive the second electrical signal and emit a fourth amplified electrical signal in response to the second electrical signal, the fourth amplified electrical signal passing to and controlling the vertical sweep deflector;

i. a second amplifier positioned to receive the third electrical signal and emit a fifth amplified electrical signal in response to the third electrical signal, the fifth amplified electrical signal passing to and controlling the horizontal sweep deflector.

In preferred embodiments of the embodiment set forth in Embodiment F:

1. A collimator and beam expander is positioned between the laser and the modulator to receive, collimate, and expand the beam of actinic radiation generated by the laser.

2. The first amplifier, the second amplifier, and the third amplifier can be video amplifiers.

3. The laser is a argon ion laser, a krypton ion laser, a pulsed nitrogen laser, or a helium cadmium laser.

In another embodiment ("Embodiment G") this invention is directed to a process for preparing a polymeric printing plate from a plate comprising a support layer and a photocurable composition coated on and supported by the support layer, the process comprising:

a. generating a beam of actinic laser radiation having an intensity sufficient to cure the photocurable composition;

b. modulating the beam of actinic laser radiation in a controlled manner;

c. orienting the beam of modulated actinic laser radiation in a controlled manner;

d. focusing the beam of oriented and modulated actinic laser radiation on the coating of photocurable composition to cure exposed portions of the photocurable composition;

e. converting data stored on a means for storing data into;
  i. a first electrical signal;
  ii. a second electrical signal; and
  iii. a third electrical signal;

f. passing the first electrical signal to a modulator to control the modulator, the modulator controlling modulation of the beam of actinic laser radiation;

g. amplifying the second electrical signal and passing the resulting fourth amplified electrical signal to a vertical sweep deflector, to control the vertical sweep deflector, the vertical sweep deflector controlling a vertical sweep pattern of the beam of modulated actinic laser radiation;

h. amplifying the third electrical signal and passing the resulting fifth amplified electrical signal to a horizontal sweep deflector to control the horizontal sweep deflector, the horizontal sweep deflector controlling a horizontal sweep pattern of the beam of modulated actinic laser radiation; and i. removing uncured portions of the photocurable composition from the support layer.

In preferred embodiments of the embodiment set forth in Embodiment G:

1. The beam of actinic laser radiation is collimated and expanded before being modulated.

2. The photocurable composition comprises a liquid polyfunctional component having molecules containing at least two reactive ethylenically or acetylenically unsaturated carbon-to-carbon bonds per molecule and a liquid polythiol component having molecules containing at least two thiol groups per molecule, with the total functionality of the polyfunctional component and the polythiol component being greater than four.

3. The laser beam has a wave length of 3,000–4,0-00A.

4. The photocurable composition contains a photocuring rate accelerator selected from the group consisting of an aryl aldehyde, a diaryl ketone, an alkyl aryl ketone, a triaryl phosphine, and a blend of a carbon tetrahalide with a polynuclear aromatic hydrocarbon. The photocuring rate accelerator can be about 0.0005–50 percent or 0.05–25 percent by weight of the photocurable composition.

5. The support layer can be metal (e.g., aluminum, copper, steel, or a steel-containing metal), plastic, or paper and an actinic laser beam absorptive layer can be intermediate the support layer and the coating of photocurable composition.

6. The unexposed photocurable composition is removed from the support layer, after exposing the plate to the laser beam, by an aqueous medium.

7. The photocurable composition can contain at least one member selected from the group consisting of a filler, a pigment, an oder mask, a light-scattering agent, a plasticizer, and an antioxidant, the weight ratio of the photocurable composition to the group member being about 1:0.00005–5.

8. The thickness photocurable composition exposed to actinic radiation can be about 0.1 mil to about 500 mils, about 0.1 to 5 mils, about 5–30 mils, or about 10–500 mils.

In another preferred embodiment ("Embodiment H") this invention is directed to a process for preparing a photocured image on a support layer from a coating of a photocurable composition on the support layer, the process comprising;

a. generating a beam of actinic laser radiation having an intensity sufficient to cure the photocurable composition;

b. modulating the beam of actinic laser radiation in a controlled manner;

c. orienting the beam of modulated actinic laser radiation in a controlled manner;

d. focusing the beam of oriented and modulated actinic laser radiation on a coating of photocurable composition on the support layer to cure exposed portions of the photocurable composition;

e. converting data stored on a means for storing data into;
  i. a first electrical signal;
  ii. a second electrical signal; and
  iii. a third electrical signal;

f. passing the first electrical signal to a modulator to control the modulator, the modulator controlling modulation of the beam of actinic laser radiation;

g. amplifying the second electrical signal and passing the resulting fourth amplified electrical signal to a vertical sweep deflector, to control the vertical sweep deflector, the vertical sweep deflector controlling a vertical sweep pattern of the beam of modulated actinic laser radiation;

h. amplifying the third electrical signal and passing the resulting fifth amplified electrical signal to a horizontal sweep deflector to control the horizontal sweep deflector, the horizontal sweep deflector controlling a horizontal sweep pattern of the beam of modulated actinic laser radiation; and i. removing uncured portions of the photocurable composition from the support layer.

DETAILED DESCRIPTION OF THE INVENTION

It is an object of this invention to provide a high speed, high resolution, relatively inexpensive method to generate an alphanumeric/graphic display with actinic laser beam radiation. Preferably incident laser radiation should be selected so that the wave length has the highest absorption cross-section in the photocurable composition.

It is an object of this invention to prepare a printing plate having a design comprised of half tone dots by selectively exposing small portions of a photocurable composition to a beam of actinic laser radiation.

It is an object of this invention to provide a means to simultaneously scan a document and reproduce it (the scanned document) as a printing plate.

It is an object of this invention to provide a method for preparing printing plates from photocurable compositions.

It is another object of this invention to provide a method for preparing printing plates from said photocurable composition by curing selected portions of a uniform coating of said photocurable composition on a support or plate by exposing such selected portions of the uniform coating of Still other objects will because of this disclosure be readily apparent to those skilled in the art.

The process of this invention can be used to prepare printing plates including planographic (including lithographic and offset) printing plates, letterpress printing plates, and itaglio printing plates.

The supporting base material (e.g., a support layer or substrate) on which a uniform coating of the photocurable composition is supported when being exposed to the actinic laser beam can be a flexible or rigid sheet, film or plate of synthetic or natural product having a smooth or matte surface reflective or nonreflective of actinic light. Metals, because of their greater strength in thinner form, are preferably employed as supports. However, where weight is critical plastic, paper, or rubber is employed as the support. Additionally, the support layer can be the photocurable composition per se. That is, a portion of the cured photocurable composition can be poured into a mold and exposed directly to actinic light to solidify the entire layer of the photocurable composition. After solidification, this layer will serve as a support for an additional amount of the photocurable composition poured on top of the support, which additional amount will form the relief by imagewise exposure to the actinic laser beam (e.g., by exposure through an image-bearing transparency or via the image-forming techniques described in Embodiments C, E, or G, supra). Another operable modification of the procedure is to cast the photocurable composition onto a transparent plate such as one made of glass, plastic, and the like. The layer can be exposed nonimagewise from one side to form a solid base, and imagewise from the other side to give the relief image. These two exposures can be made simultaneously or in consecutive fashion as desired.

Suitable metals for a support include steel, aluminum, magnesium, copper, chromium, and the like. Additionally, various film-forming plastics can be used such as addition polymers; vinylidene polymers, e.g., vinyl chloride, vinylidene chloride copolymers with vinyl chloride, vinyl acetate, styrene, isobutylene, and acrylonitrile; vinylchloride copolymers with the latter polymerizable monomers; the linear condensation polymers such as the polyesters, e.g., polyethylene terephthalate; the polyamides, e.g., polyhexamethylene sebacamide; polyester amides, e.g., polyhexamethyleneadipamide/adipate; and the like. Fillers or other reinforcing agents can be present in the synthetic resin or polymer support such as various fibers (synthetic, modified, or natural), e.g., cellulosic fibers such as cotton, cellulose acetate, viscose rayon, and paper, glass wool; nylon; and the like. These reinforced bases may be used in laminated form.

When the support is highly reflective (e.g., aluminum) the actinic laser beam passing through the photocurable composition may reflect off the support at such an angle as to cause curing in non-image areas. To avoid this, an actinic radiation absorptive layer can be employed between the reflective support and the photocurable composition.

The light-absorptive layer intermediate between the light-reflective support and the photocurable composition can be made from various materials. Suitable materials of this type are dyes and pigments. Useful inorganic pigments for a radiation-absorptive layer include iron oxide in various forms, e.g., Indian red, Venetian red, ocher, umber, sienna, iron black, and the like; lead chromate, lead molybdate (chrome yellow and molybdenum orange); cadmium yellow, cadmium red; chromium green; iron blue; manganese black; various carbon blacks such as lamp black, furnace black, channel black; and the like. Organic dyes soluble in the vehicles normally used in applying the light-absorptive layer are generally best added as pigments in the form of lakes prepared by precipitating an insoluble salt of the dye on an inert inorganic substrate. A list of such lakes and similar organic pigments is shown in "Printing and Litho Inks," J. H. Wolfe, pages 124–173, Fourth Edition, MacNair-Dorland and Co., New York (1949).

If a light-absorptive layer is employed as taught above, it must have adequate adhesion to the support and photocured layer. Said adhesion is usually supplied by suitable polymeric or resin carriers which include, but are not limited to, vinyl halides, e.g., polyvinyl chloride; vinyl copolymers particularly of vinyl halides, e.g., vinyl chloride with vinyl acetate, diethyl fumarate, ethyl acrylate, allyl glycidyl ether, glycidyl methacrylate; vinyl chloride/vinyl acetate/maleic anhydride copolymer; polyvinyl butyral; monomeric dimethylacrylate esters of the polyethylene glycols in combination with vinyl chloride copolymers; styrene or diallyl phthalate with polyesters such as diethylene glycol maleate, diethylene glycol maleate/phthalate, triethylene glycol fumarate/sebacate; and the like.

Suitable materials employed as a light-absorptive material used with a reflective support are dyes and pigments. Pigments are preferred primarily because they do not bleed into the photocurable layer. In any event, these materials must be unreactive with the photocurable layer. These light absorptive materials are preferably applied to the support in suspension in a polymer or resin capable of adhering to the support and the photocurable composition.

One advantage of the instant invention is that line and halftone relief printing plates can be prepared very rapidly.

Further, a photographic negative is no longer required to produce the image. An additional advantage is that the scanned laser beam of the instant invention is readily amenable to computer control and therefore lends itself to computer composition of alphnumeric/graphic characters.

Exposure time will vary with the particular photocurable composition, the thickness of the layer to be cured, the photoinitiator (curing rate accelerator), and the intensity of the laser beam; but exposure for total exposure periods to a newspaper size plate (i.e., ca. 17 × 23 inches) of about 1 to about 10 minutes are generally employed.

Exposure is for a time effective to cure the exposed portions of photocurable composition, and because of our disclosure can readily be determined by those skilled in the art. It is understood that multiple scanning techniques wherein a spot is exposed more than once can be used.

Photocurable compositions which can be used with excellent results to prepare printing plates by the process of this invention include photocurable compositions comprising a liquid polyfunctional component having molecules containing at least two reactive ethylenically or acetylenically unsaturated carbon-to-carbon bonds per molecule, and a liquid polythiol component having molecules containing at least two thiol groups per molecule, with the total functionality of the polyfunctional component and the polythiol component being greater than four. Such compositions are well known to those skilled in the art. See U.S. Pat. Nos. 3,615,450; 3,537,853; 3,535,193; and 3,578,614 for disclosures teaching such compositions.

Other photocurable compositions which can be used with excellent results in the process of this invention include polyvinylcinnamate resins crosslinkable by ultra violet light, methacrylates and polymethracrylates capable of undergoing vinyl polymerization in the presence of photoinitiators such as benzoin, anthraquinone, and those listed infra, colloids such as gelatin, animal gum, and polymers such as polyvinylalcohol crosslinkable in the presence of chromium salts, and latexes of polyvinylacetate, polyvinylchloride, polyvinylnitrile, etc, stabilized with polyvinylalcohol—such latexes being sensitized to photocrosslinking by ultra violet light by the addition of chromium salts.

Novel apparatus excellently adapted for conducting the process of this invention is set forth in the above Summary, in the Preferred Embodiments, and in the Drawings directed to apparatus. Excellent techniques for conducting said process are set forth in the Preferred Embodiments directed to process and in the examples illustrating the use of laser beams to prepare printing plates.

The instant invention provides a method for preparing a printing plate by selectively exposing a photocurable composition to an actinic laser beam. Upon exposure to said laser beam the exposed areas of the photocurable composition is cured rapidly and controllably to form a highly acceptable design of uniform relief. Thereafter the uncured composition is removed from the unexposed areas as desired.

Standard techniques which are well known to those skilled in the art can be used to remove the unexposed (uncured) photodurable composition. Such techniques include (but are not limited to) washing the unexposed composition from the substrate with a solvent which does not appreciably attack, swell, or dissolve either the substrate or the insoluble composition which was formed by photocuring the photocurable composition, brushing the unexposed composition from the substrate, wiping the unexposed composition from the substrate with a cloth, blotter, sponge or the like which can be moistened or wetted with a solvent (which does not dissolve, significantly swell or appreciably attack the support layer (substrate) or the cured photocurable composition). Alternatively, the unexposed photocurable composition can be removed by other mechanical means. If desired, the printing plate can be dried after washing.

If desired, after etching (removing the uncured photocurable composition from unexposed areas of the plate), the plate can be post exposed to actinic radiation using either a laser beam of actinic radiation or another source of actinic radiation such as an ultraviolet light. Post exposure which cures and hardens underexposed (and consequently undercured) areas of the plate is especially useful with relief plates.

Photocuring rate accelerators can be included in the photocurable compositions used in the process of this invention.

Specifically useful herein are chemical photocuring rate accelerators (photoinitiators) such as benzophenone, acetophenone, acenaphthenequinone, o-methoxybenzophenone, thioxanthen-9-one, xanthen-9-one, 7H-benz[de]anthracen-7-one, dibenzosuberone, 1-naphthaldehyde, 4,4'-bis(dimethylamino)-benzophenone, fluoren-9-one, 1'-acetonaphthone, 2'-acetonaphthone, anthraquinone, 1-indanone, 2-tert-butylanthraquinone, valerophenone, hexanophenone, S-phenylbutyrophenone, p-morpholinopropiophenone, 4-morpholinobenzophenone, 4'-morpholinodeoxybenzoin, p-diacetylbenzene, 4-aminobenzophenone, 4'-methoxyacetophenone, benzaldehyde, α-tetralone, 9-acetylphenanthrene, 2-acetylphenanthrene, 10-thioxanthenone, 3-acetylphenanthrene, 3-acetylindole, 1,3,5-triacetylbenzene, and the like, including blends thereof, to greatly reduce the exposure time.

The curing rate accelerators are usually added in an amount ranging from about 0.0005 to about 50 percent by weight of the photocurable composition, with a preferred range being from about 0.05 to about 25 percent by weight. Preferred photocuring rate accelerators are the aldehyde and ketone carbonyl compounds having at least one aromatic nucleus attached directly to the $$-\overset{O}{\overset{\|}{C}}-$$

group.

The photocurable composition may, if desired, include additives such as antioxidants, accelerators, dyes, inhibitors, activators, fillers, pigments, antistatic agents, flame-retardant agents, thickeners, thixotropic agents, surface-active agents, viscosity modifiers, extending oils, plasticizers, tackifiers, and the like within the scope of this invention. Such additives are usually preblended with the polyene or polythiol prior to or during the compounding step. Operable fillers include natural and synthetic resins, carbon black, glass fibers, wood flour, clay, silica, alumina, carbonates, oxides, hydroxides, silicates, glass flakes, glass beads, borates, phosphates, diatomaceous earth, talc, kaolin, barium sulfate, calcium sulfate, calcium carbonate, antimony oxide, and the like. The aforesaid additives may be present in quantities up to 500 parts or more per 100 parts polymer by weight and preferably about 0.005 to about 300 parts on the same basis.

Conventional curing inhibitors or retarders which can be used in order to stabilize the components or curable compositions so as to prevent premature onset of curing may include hydroquinone; p-tert-butyl catechol; 2,6-di-tert-butyl-p-methylphenol; phenothiazine; N-phenyl-2-naphthylamine; inert gas atmospheres such as helium, argon, nitrogen, and carbon dioxide; vacuum; and the like.

The majority of the commercially available monomers and polymers used in the photocurable compositions normally contain minor amounts (about 50–5,000 parts per million by weight) of inhibitors to prevent spontaneous polymerization prior to use in making a printing plate. The presence of these inhibitors, which are usually antioxidants, e.g., hydroquinone and the like, in optimum amounts causes no undesirable results in the photocurable layer of this invention. One advantage of the instant invention is that line and halftone relief printing plates can be prepared very rapidly. Naturally, the time will vary with the particular photocurable composition, the thickness of the layer to be cured, the photoinitiator (curing rate accelerator), and the intensity of the laser beam. Exposure to prepare a printing plate about 17 × 23 inches using a 250 milliwatt laser is generally about 5 minutes. However, longer and shorter periods have been used with excellent results. As used herein the term exposure time means the time required to scan the whole plate. Multiple scans can be used in which instance exposure time is the product obtained by multiplying the number of scans by the time used per scan.

In general, short curing periods are achieved in applications where thin films of curable composition are required, whereas longer curing periods are achieved and desired where more massive layers of composition are required.

Any type of laser producing actinic radiation can be used in carrying out the process (or method) of this invention. However, I generally prefer an argon ion laser, a krypton ion laser, a helium-cadmium laser, or a pulsed nitrogen laser.

The apparatus and general process of this invention can be used with excellent results to prepare printed circuits by using a transparency having a circuit drawn thereon where using the general process of Embodiment A, by using a document (or paste-up) comprising a drawing of a circuit where using the general process of Embodiments C or E, and by using a magnetic tape (or other equivalent means for storing data such as a magnetic disk, a punched paper tape, a punched polymer tape or the like) having data therein yielding the design of a printed circuit where using the general process of embodiment G. Where preparing a printed circuit by a subtractive process a support layer or substrate (e.g., a polymer, glass, or ceramic material) which does not conduct electricity is coated with a thin film or coating of a conducting metal (e.g., silver or copper), the coating of metal being bonded to the substrate, and a uniform coating of photocurable composition is applied to the film of metal. After exposure to a beam of actinic laser radiation to cure a design corresponding to the printed circuit, the unexposed and uncured portion of the photocurable composition is removed and the portion of the metal film which was under the uncured portion of the photocurable composition is removed (e.g., by etching with acid) to yield the desired printed circuit. This process can also be used by making appropriate modifications to prepare a printed circuit by an additive process.

FIG. 1 illustrates apparatus of the instant invention in which a laser shown at 1 produces a beam of coherent actinic radiation (a laser beam) 25 with a preselected intensity and a preselected wavelength. The diameter and divergence of the laser beam can be adjusted with pre-optics 2 (i.e., a beam expander and collimator) which can be omitted. The laser beam diameter is chosen to optimize energy throughput in later recited modulating and scanning devices. The laser can be a continuous wave (CW) type of a pulsed output type. The incident energy supplied to the photocurable composition can be adjusted by; (a) varying the laser outut power; (b) varying the rate at which the laser beam moves with respect to the imaged material; (c) adjusting the beam diameter with a lens system; (d) using multiple scanning; or (e) using combination of the above. Details of lasers and laser beams are well known to those skilled in the art. A laser excellently adapted for use in all embodiments of this invention is the continuous wave Model 53 Argon Ion Laser produced by Coherent Radiation Laboratories, Palo Alto, California. Another laser excellently adapted for use in this invention include Model C 5,000 pulsed nitrogen laser produced by Avco Everett Research Laboratory, Everett, Mass.

Collimated and expanded laser beam 3 passes through modulator 4 which modulates the laser beam at about 97 percent contrast. The resulting modulated laser beam 5 passes to scanning apparatus 6.

The modulator can be a conventional Pockles cell such as the Model 541 with No. 504 Driver produced by Isomet, Inc., Oakland, N.J. Another modulator excellently adapted for use in this invention in the Model EOM-3064 produced by Lasermetrics, Inc., Rochell Park, N. J. Modulated laser beam 5 is deflected by scanning apparatus 6 (which can be an electro-optic, an acousto-optic scanning apparatus, or a rotating or oscillating mirror vertical deflector 32 and horizontal deflector 33) to generate a raster scan or a random access scan. A scanning apparatus (or device) excellently adapted for use in this invention is Model 232 XY Laser Beam Scanner produced by Spectra Division of Spectra Physics, Rochester, N. Y. This device is an electro-optic device. Other scanning apparatus excellently adapted for use in this invention can also be obtained from Isomet, Inc., Oakland, N. J.

Electrical signal 7 directed from later-recited amplifier 17 to modulator 4 determines whether the laser beam is on or off. Electrical signals 60 and 61 from master clock 19 are directed to vertical sweep generator 20 and horizontal sweep generator 21, respectively. The vertical sweep generator 20 and horizontal sweep generator 21 can be hard-wired electronic apparatus or a programmed minicomputer. Both are excellently adapted for use in this invention. Digital Equipment's PDP-8 which can be obtained from Digital Equipment Co., Maynard, Mass., is a preferred device or apparatus for use in this invention; said device comprising both a vertical sweep generator and a horizontal sweep generator. Other minicomputers excellently adapted for use in this invention are well known to those skilled in the art.

Electrical signals 34 and 35 from vertical sweep generator 20 and horizontal sweep generator 21, respectively, pass to amplifiers 36 and 37, respectively.

Electrical signals 30 and 31, from amplifiers 36 and 37, respectively, are directed to and control vertical deflector 32 and horizontal deflector 33, respectively (said vertical and horizontal deflectors comprising, as noted supra, scanning device or apparatus 6) which orient modulated laser beam 5 (the laser beam exit modulator 4) to determine the position of oriented and modulated laser beam 8 in space. Oriented and modulated laser beam 8 emerging from scanning device 6 is focused by a variable or fixed focal length lens system 9 to produce focused, oriented, and modulated laser beam 10, said beam 10 being focused on a coating, sheet, or film of the aforesaid photocurable composition 23. The photocurable composition 23 being present as a uniform coating on support layer 190 the support layer with the coating of photocurable composition comprising plate 101, said plate being supported by first support 102 (see FIG. 5).

A small fraction (or minor beam) 40 of focused scanning laser beam 10 is diverted to transparency 11 by partially reflecting mirror (beamsplitter) 12 and prism 45, the prism being optional. Fraction 40 of said laser beam is transmitted through transparency 11, which is supported by second support 120 (see FIG. 7). The emerging beam passes through a lens system 13 to produce focused beam (or signal) 14 which enters photomultiplier tube 15. Photomultiplier tube 15 converts beam 14 to electrical signal 16. Electrical signal 16 is further amplified by amplifier 17 (e.g., a video amplifier which converts electrical signal 16 to amplified electrical signal 7 which is relayed to laser beam modulator 4 to complete the feedback loop.

In a preferred embodiment, transparency driving mechanism 18, activated by signal 62 from master clock 19, can be used to position a new transparency in preparation for the exposure of a new printing plate.

The above description recites a preferred method whereby alphanumeric/graphic or other input signals are readily converted to a controlled output laser beam 10 which induces polymerization of photocurable composition 23. By modulating the scanning laser beam, the image that is produced on the plate is indicated by regions of cured polymer or uncured photocurable composition. The uncured photochemical composition is removed in a conventional manner, such as solvent extraction, leaving behind an image in relief on the plate.

Figures 2, 5:
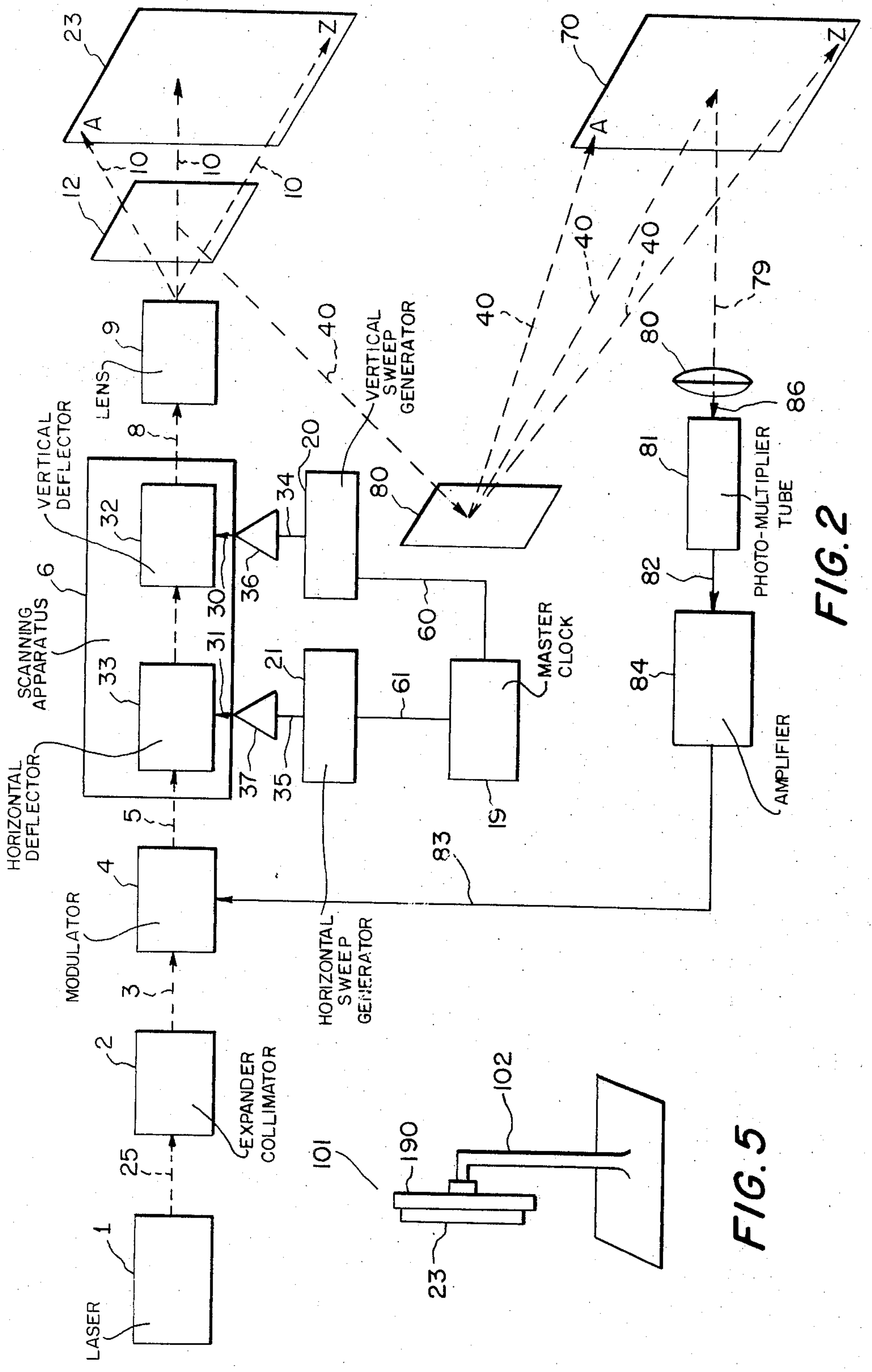
FIG. 2 is a schematic diagram of another possible embodiment of an apparatus that can be used to produce a printing plate.
FIG. 5 is a schematic representation of a support (a first support) holding a plate comprising a support layer with a coating of photocuarble composition thereon for use in preparing a printing plate with the apparatus and by the process of my invention.

FIG. 2 represents an Embodiment wherein the apparatus of FIG. 1 is modified to produce a printing plate for printing copies of an opaque document (e.g., a printed or typed page) rather than copies of material on a transparency. Laser 1 produces a beam of actinic radiation (a laser beam) 25 which can be expanded and collimated by expander-collimator 2 to yield an expanded and collimated laser beam 3 which passes to modulator 4 which modulates the laser beam to yield a modulated laser beam 5 at about 97 percent contrast. The expander and collimator is optional. The resulting modulated laser beam 5 passes to scanning apparatus 6 which comprises horizontal deflector 33 and vertical deflector 32.

Electrical signal 83 from later-recited amplifier 84 determines whether the laser beam is on or off.

Electrical signal 60 and 61 from master clock 19 are directed to vertical sweep generator 20 and horizontal sweep generator 21 respectively.

Electrical signals 34 and 35 from vertical sweep generator 20 and horizontal sweep generator 21, respectively, pass to amplifiers 36 and 37, respectively.

Electrical signals 30 and 31, from amplifiers 36 and 37, respectively, are directed to and control vertical deflector 32 and horizontal deflector 33, respectively (said vertical and horizontal deflectors comprising, as noted supra, scanning device or apparatus 6) which orient modulated laser beam 5 (laser beam exit modulator 4) to determine the position of the resulting oriented and modulated laser beam 8 in space.

Oriented and modulated laser beam 8 emerging from scanning device 6 is focused by a focusing means 9 to produce focused, oriented, and modulated laser beam 10, said beam being focused on a plate, sheet, or film of the aforesaid photocurable composition 23 coated on and supported by support layer 90; said coating of photocurable composition and said support layer comprising plate 101, said plate 101 being supported by first support 102 (see FIG. 5). A small fraction (or minor beam) 40 of focused scanning laser beam 10 is diverted to document 70 (which is supported by second support 110 (see FIG. 6)) by partially reflecting mirror 12 and totally reflecting mirror 80. The totally reflecting mirror is optional.

A fraction 79 of the small fraction (minor beam) 40 is reflected from document 70. Focusing means 80 focuses reflected minor laser beam 86 onto photmultiplier tube 81 which emits electrical signal 82 in response to beam 79. Amplifier 84 (e.g., a video amplifier) receives electrical signal 82 and emits amplified electrical signal 83 in response thereto. Amplified electrical signal 83 is relayed to modulator 4 to complete the feedback loop.

Figures 3, 6:
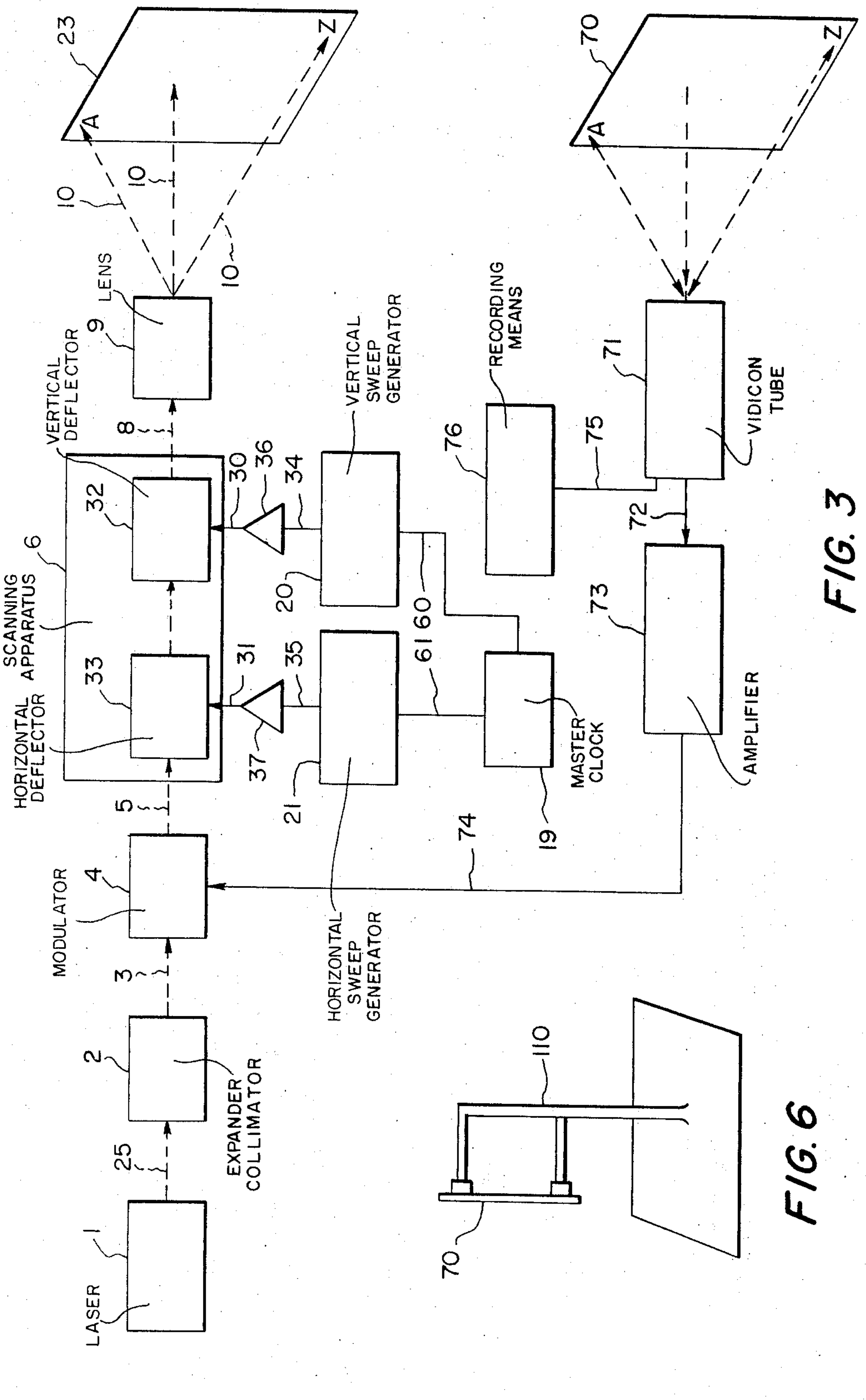
FIG. 3 is a schematic diagram of a third possible embodiment of an apparatus which can be used to produce a printing plate.
FIG. 6 is a schematic representation of a support holding a document to be reproduced with the apparatus and by the techniques of Embodiments B and C, and D and E of my invention, said Embodiments being recited infra.

FIG. 3 represents another embodiment wherein the apparatus of FIG. 1 is modified to produce a printing plate for printing copies of an opaque document (e.g., a printed page).

Laser 1 produces a beam of coherent actinic radiation (a laser beam) 25 with a preselected intensity and preselected wave length. The diameter and divergence of a laser can be adjusted with pre-optics 2 (a beam expander and collimator) which can be omitted.

Collimated and expanded laser beam 3 passes through modulator 4 which modulates the laser beam at about 97 percent contrast. The resutling modulated laser beam 5 passes to scanning apparatus 6. Modulated laser beam 5 is deflected by scanning apparatus 6 comprising horizontal deflector 33 and vertical deflector 32 to generate a raster scan or random access scan. Electrical signal 74 directed from later-recited amplifier 73 to modulator 4 determines whether the laser beam is on or off. Electrical signal 60 and 61 from master clock 19 are directed to vertical sweep generator 20 and horizontal sweep generator 21, respectively.

Electrical signals 34 and 35 from vertical sweep generator 20 and horizontal sweep generator 21, respectively, pass to amplifiers 36 and 37 respectively. Electrical signals 30 and 31 from amplifiers 36 and 37, respectively are directed to and control vertical deflector 32 and horizontal deflector 33, respectively.

Oriented and modulated laser beam 8 emerging from scanning device 6 is focused by a focusing means 9 to produce focused, oriented, and modulated laser beam 10, said beam being focused on coating, sheet, or film of the aforesaid photocurable composition 23. Photocurable composition 23 is coated on and supported by support layer 190; said coating of photocurable composition and said support layer comprising plate 101, said plate being supported by first support 102 (see FIG. 5).

Vidicon tube 71 scans document 70 which is supported by second support 110 (see FIG. 6) and produces electrical signal 72 in response to signals received from such scanning. Electrical signal 72 if further amplified by amplifier 73 (e.g., a video amplifier); resulting amplified electrical signal 74 is relayed to laser beam modulator 4 to complete the feedback loop.

In another embodiment of this invention the data from document 70 are stored on a magnetic tape or equivalent. Where using this embodiment document 70 is scanned by vidicon tube 71 which produces electrical signal 75 which passes to recording means 76 where the signal is recorded and stored for later use in producing a printing plate.

Figures 4, 7:
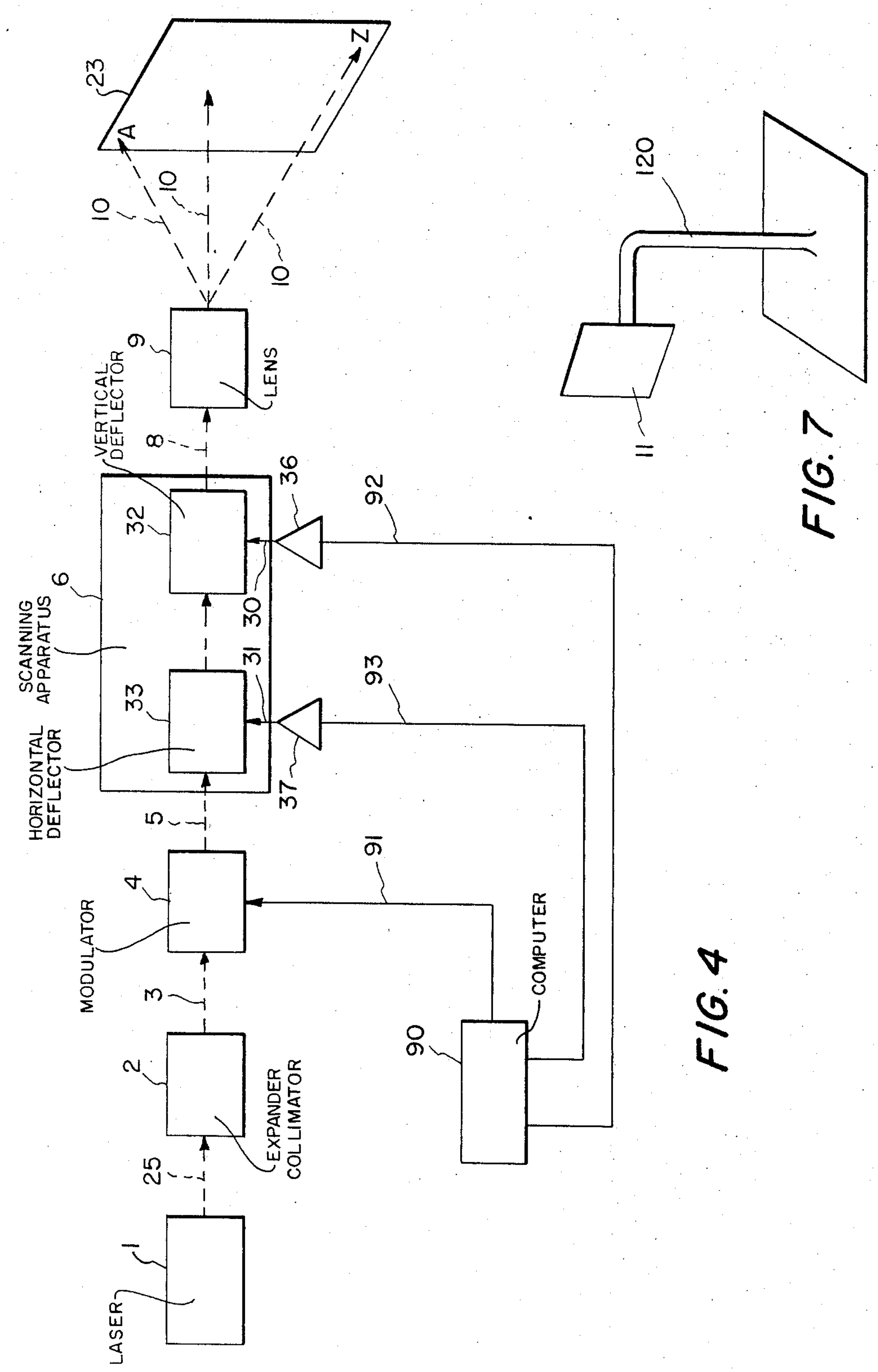
FIG. 4 is a schematic diagram of a fourth possible embodiment of an apparatus which can be used to produce a printing plate.
FIG. 7 is a schematic representation of a support holding a transparency bearing data or a design to be reproduced with the apparatus recited in the above Summary using the technique recited in Embodiment A, infra.

FIG. 4 represents an embodiment wherein the apparatus of FIG. 1 is modified to produce a printing plate from data stored on a magnetic tape the design on the printing plate being controlled by the signals from the mageneic tape. Laser 1 produces a beam of coherent actinic radiation (a laser beam) 25 with a preselected intensity and preselected wave length. The diameter and divergence of the laser beam can be adjusted with pre-optics 2 (i.e., a beam expander and collimator) which can be omitted.

Collimated and expanded laser beam 3 passes through modulator 4 which modulates the laser beam at about 97 percent contrast. The resulting modulated laser beam 5 passes to scanning apparatus 6 (a horizontal deflector 33 and a vertical deflector 32) which orients modulated laser beam 5 (the laser beam exit modulator 4) to determine the position of the resulted oriented and modulated laser beam 8 in space.

Oriented and modulated laser beam 8 emerging from scanning device 6 is focused by focusing means 9 on a coating, sheet, or film of the aforesaid photocurable composition 23 the photocurable composition 23 being present as a uniform coating on support layer 190, the support layer and the coating of photocurable composition thereon comprising plate 101, said plate being supported by support 102 (see FIG. 5).

Computer 90 emits three electrical signals, signals 91, 92, and 93, respectively, in response to the data present on the magnetic tape. Electrical signal 91 passes to and controls modulator 4 which determines whether the laser beam is on or off. Electrical signal 92 passes to amplifier 36 which emits amplified electrical signal 30 in response to electrical signal 92. Electrical signal 93 passes to amplifier 37 which emits amplified electrical signal 31 in response to electrical signal 93. Electrical signals 30 and 31 from amplifiers 36 and 37, respectively, are directed to and control vertical deflector 32 and horizontal deflector 33, respectively, to determine the position or oriented and modulated laser beam 8 in space.

Where using the embodiment represented by FIG. 4, data from the tape can be processed by an International Business Machines Model 360-40 computer or other similar computer.

Editing can be readily accomplished by an interactive computer terminal such as a Harris-Intertype Model 1,100 or a Tektronix Model 4002A.

EXAMPLE 1

678 g. (0.34 mole) of a commercially available polyoxypropylene glycol sold under the trade name NIAX by Union Carbide Co. and having a molecular weight of about 2,025 were degassed for 2 hours at 100°C and thereafter charged to a resin kettle maintained under a nitrogen atmosphere and equipped with a condenser, stirrer, thermometer, and gas inlet and outlet. 118 g. (0.68 mole) of tolylene-2,4-diisocyanate were charged to the kettle and the reaction was heated with stirring for 2 ¾ hours at 120°C. After cooling, 58 g. (1.0 mole) of allyl alcohol were added to the kettle and the mixture was refluxed at 120°C for 16 hours under nitrogen. Traces of excess allyl alcohol were removed overnight by vacuum at 100°C. The allyl terminated liquid prepolymer having a viscosity of 19,400 cps at 30°C as measured on a Brookfield Viscometer was removed from the kettle and hereinafter will be referred to as Prepolymer A.

EXAMPLE 2

A liquid photocurable composition was prepared by mixing 100 g. (0.04 mole) or Prepolymer A from Example 1 herein, 11 g. (0.02 mole) of pentaerythritol tetrakisβ-mercaptopropionate) commercially available from Carlisle Chemical Co. under the trade name Q-43, and 1.5 g. (0.000 mole) of benzophenone commercially available in reagent grade from Fisher Scientific Co. The mixture was heated to 70°C to dissolve the benzophenone, thereby producing a clear homogeneous mixture having a viscosity in the range of 12,000–18,000 cps at 30°C.

A suitable mold for making a printing plate was prepared using a 4 mil thick subbed Mylar film, i.e., subbed poly(ethylene terephthalate) commercially available from Anken Chemical and Film Corp., as a support with a 35 mil thick rubber electric tape stuck thereto about its edges in order to form a frame to contain the liquid photocurable composition. The mold was leveled on an adjustable flat table and the liquid photocurable composition at a temperature of 70°C was poured into the mold along the edge of the frame and distributed evenly throughout the mold with a doctor blade. This technique produced a substantially flat printing surface (a substantially uniform coating of the photocurable composition supported on the Mylar support layer or substrate) having a thickness tolerance of ± 1 mil. and being about the size of a page of newspaper (i.e., ca. 16 ½ × 22 ½ inches). The coating of photocurable composition had a first surface and a second surface; the first surface was in contact with the Mylar support layer and the second surface was exposed to the atmosphere.

The plate comprising the subbed Mylar support layer with the coating of photocurable composition thereon was mounted in the first support and exposed to a beam of actinic laser radiation using the apparatus recited in the above Summary and the technique of Embodiment A, supra. See FIG. 1 and the above text which further describes the embodiments illustrated by FIG. 1. A transparency (about 4 × 6 inches) was mounted in the second support. This transparency was a photocopy of a page from a newspaper.

Exposure time (the time the laser beam irradiated the whole plate was about 5 minutes. The laser was an argon ion laser; it had an output of about 250 milliwatts.

The liquid photocurable composition gelled in the image areas. The nonimage areas remained a liquid of essentially the same viscosity as before exposure.

After exposure the uncured liquid portion of the photocurable composition was removed by pouring a small amount of a liquid nonionic surfactant, e.g., Pluronic L-81 commercially available from Wyandotte Chemical Co., on the plate, brushing it (the plate) with a paint brush and rinsing the liquid away with warm tap water. The photocurable composition in the image areas was observed to have gelled all the way through to the Mylar film support producing a line image having a thickness of 35 mils. The surface of the nonimage areas of the plate was the Mylar film support. The relief image adhered well to the Mylar film support and was not removed by the rinsing or developing operation. The developed plate was dried and post exposed in the absence of the transparency to the laser beam to harden and detackify the surface. Exposure time for post exposure was about 120 seconds using a 4,000 watt input mercury vapor lamp.

The thus-formed plate was mounted on a newspaper press using double-face pressure-sensitive tape and printing was carried out in the same way conventional metal photoengraved plates are employed. The printing results obtained were superior to those with conventional stereotype plates.

Several modified replications of the above run were made using the general procedure recited therein. However, in these replications:

1. The photocurable composition of the above run was replaced with a photocurable composition prepared by:

Changing 1 mole of commercially available tolyene diisocyanate into a resin kettle equipped with a condenser, stirrer, thermometer, and gas inlet and outlet. 2 moles of the diallyl ether of trimethylpropane was slowly added to the kettle. After the addition was complete, 4 grams of dibtuyl tin dilaurate as a catalyst was added to the kettle and the reaction was continued for 30 minutes to 70°C under an atmosphere of nitrogen. The thus formed 1 mole of allyl terminated liquid prepolymer was admixed with 1 mole of pentaerythritol tetrakis (β-mercaptopropionate) ommercially available from Carlisle Chemical Co. under the tradename "Q-43" and 1.5 g. benzophenone to form a photocurable composition disignated "Photocurable Composition C."

Results obtained where preparing printing plates from said Photocurable Composition C were indistinguishable from those, reported supra, with the photocurable composition prepared from Prepolymer A.

2. The embodiments recited in: (a) Embodiments B and C, supra, and further amplified or illustrated by FIG. 2 and the text describing the embodiments represented by said FIG. 2; (b) Embodiments D and E, supra, which are further amplified or illustrated by FIG. 3 and the text describing the embodiments represented by said FIG. 3; and (c) Embodiments F and G, supra, which are further amplified or illustrated by FIG. 4 and the text describing the embodiments represented by said FIG. 4 were used in place of the embodiments of the Summary and Embodiment A.

Where using the embodiments represented by Embodiments B and C, and D and E printing plates were prepared for reproducing data from "paste-ups" comprising, in each instance, a newspaper page.

Where using the embodiments represented by Embodiments G and F printing plates were prepared for reproducing data stored on magnetic tape. Runs were made using these embodiments to prepare; (a) printing plates for printing a newspaper (letterpress plates): (b) intagilo (rotogravure) plates; and (c) offset plates.

3. The Mylar support layer was replaced with aluminum, copper, carbon steel, stainless steel, paper, and glass support layers. In some runs, especially where using metal support layers actinic laser beam absorptive layers were placed between the support layer layers and the photocurable composition coated thereon. Materials which gave excellent results included iron oxide, lead chromate cadmium yellow, lead molybdate, cadmium yellow, cadmium red, chrome green, iron blue, manganese black, carbon black, lamp black, and furnace black.

In each instance the resulting plate was used to print copies, and the printing results obtained were superior to those with conventional plates.

EXAMPLE 3

1. mole of a commercially available polyoxypropylene glycol having a molecular weight of about 1,958 and a hydroxyl number of 57.6 was charged to a resin kettle equipped with a condenser, stirrer, thermometer, and a gas inlet and outlet. 4 g. of dibutyl tin dilaurate as a catalyst were added to the kettle along with 348 g. (2.0 moles) of tolylene-2,4-diisocyanate and 116 g. (2 moles) of allyl alcohol. The reaction was carried out for 20 minutes at room temperature under nitrogen. Traces of excess alcohol were stripped from the reaction kettle by vacuum over a 1-hour period. The thus-formed $CH_2$=CH— terminated liquid prepolymer had a molecular weight of approximately 2,400 and will hereinafter be referred to as Prepolymer B.

EXAMPLE 4

A liquid photocurable composition was prepared by combining 100 g. (0.04 mole) of Prepolymer B from Example 3 herein, 11 g. (0.02 mole) of pentaerythritol tetrakis (β-mercaptopropionate), and 1.5 g. (0.008 mole) of benzophenone. The mixture was heated to 70°C to dissolve the benzophenone, producing a clear homogeneous mixture having a viscosity in the range of 12,000–18,000 cps.

A suitable mold for making a printing plate was prepared by adhering a pressure-sensitive 35 mil thick rubber electrical tape to the edges of a 4 mil thick subbed Mylar film support, commercially available from the Anken Chemical and Film Corp. under the trade name M41-D, to form a mold 5⅛ inch × 5⅛ inch. An additional portion of the support was formed by pouring 31.0 g. of the liquid photocurable composition at a temperature of 70°C into the mold and exposing it directly (without the use of a transparency) to actinic radiation from the laser used in Example 1. Exposure time (as defined in Example 2) was 5 minutes. The entire 31.0 portion of photocurable composition was cured, it adhered firmly to the Mylar support, and thereby formed an additional portion of the support. An additional layer of pressure-sensitive 35 mil thick rubber electrical tape was placed on top of that already adhering to the support and 12.9 g. of the liquid photocurable composition at a temperature of 70°C was poured into the new mold and distributed evenly throughout. The resulting plate was designated "Plate A."

The general procedure of Example 2 was to prepare a printing plate from Plate A. In this instance the transparency placed in the second support was a line negative. Exposure time, as defined in Example 2, was 5 minutes. After exposure the uncured portion of the photocurable composition was washed with a small amount of a liquid monionic surfactant, e.g., Pluronic L-81. The thus-formed printing plate was brushed with a paint brush and thereafter rinsed with warn tap water to remove the uncured portion of the plate. The post exposure used in Example 2 was omitted in this run.

This printing plate mounted on a newpaper press using double-face pressure-sensitive tape produced results superior to those obtained with a conventional lead stereotype plate.

In other runs using the general procedure of Example 4:

1. The transparency was replaced with a document (a paste up a printed page) using the embodiments illustrated by FIG. 2 and recited in Embodiments B and C.

2. The transparency was replaced with a document (a paste up of printed page) using the embodiments illustrated by FIG. 3 and recited in Embodiments D and E.

3. The transparency was replaced with a magnetic tape (having data to be printed stored thereon) using the embodiments illustrated by FIG. 4 and recited in Embodiments F and G.

4. The photocurable composition of Example 4 was replaced with the following photocurable compositions:

Polyvinylcinnamate resins crosslinkable by ultra violet light, methacrylates capable of undergoing vinyl polymerization in the presence of photoinitiators (e.g., benzoin, anthraquinone, and those listed in the following paragraph), colloids such as gelatin, animal gums, and polymers such as polyvinylalcohol crosslinkable in the presence of chromium salts, and latexes of polyvinylacetate, polyvinylchloride, polyvinylnitrile, and the like stabilized with polyvinyalcohol—such latexes being sensitized to photocrosslinking by ultra violet light by the addition of chromium salts. In each instance a printing plate of excellent quality was obtained, and each printing plate was used to print pages of excellent quality.

5. The benzophenone was replaced with acetophenone, acenaphthenequinone, o-methoxybenzophenone, thioxanthen-9-one, xanthen-9-one, 7H- benz[de]anthracen-7-one, dibenzosuberone, 1-naphthaldehyde, 4,4′-bis(dimethylamino) benzophenone, fluoren-9-one, 1′-acetonaphthone, 2′-acetonaphthone, anthraquinone, 1-indanone, 2-tert-butylanthraquinone, valerophenone, hexanophenone, 8-phenylbutyrophenone, p-morpholinopropiophenone, 4-morpholinobenzophenone, 4′-morpholinodeoxybenzoin, p-diacetylbenzene, 4-aminobenzophenone, 4′-methoxyacetophenone, benzaldehyde, α-tetralone, 9-acetylphenanthrene, 2-acetylphenanthrene, 10-thioxanthenone, 3-acetylphenanthrene, 3-acetylindole, and 1,3,5-triacetylbenzene, including blends thereof.

These curing rate accelerators (photoinitiators) were added in an amount ranging from about 0.0005 to about 50 percent by weight of the photocurable composition; the preferred range was from about 0.05 to about 25 percent by weight.

6. A number of fillers were included in photocurable compositions. These fillers were natural and synthetic resins, carbon black, glass fibers, wood flour, clay, silica, alumina, carbonates, oxides, hydroxides, silicates, glass flakes, glass beads, borates, phosphates, diatomaceous earth, talc, kaolin, barium sulfate, calcium sulfate, calcium carbonate, antimony oxide, and the like. The aforesaid additives were present in quantities up to 500 parts or more per 100 parts polymer by weight and preferably about 0.005 to about 300 parts on the same basis.

In each instance the resulting plate was used to print copies, and the printing results were superior to those obtained with conventional plates.

The procedures set forth herein provide useful, simple, and effective means for producing original, direct relief printing plates from inexpensive materials with a marked reduction in labor and time requirements over the conventional procedures. The relief images obtained are sharp and show fidelity to the original transparency both in small details and in overall dimensions. In addition, preparation of many types of ruled line plates are possible which could ordinarily be handled only by tedious engraving techniques.

The prepared printing plates permit efficient use of valuable press time since the flatness of the printing surfaces reduces the amount of make ready required. A smooth, clean shoulder of the printing relief image minimizes ink buildup during use and saves much of the time spent in cleaning operations during a press run.

Under optimum conditions the present printing plates show wear resistance equivalent to that of the expensive nickel-faced electrotypes of chromium plated metallic plates.

The lightness in weight of the present plates permits easier handling characteristics, faster printing press speeds, and the use of lighter weight printing presses. These factors become obvious when it is realized that a newspaper stereotype printing plate weighs 55 pounds as contrasted to less than 0.5 pound for the preferred plates prepared according to the method of this invention.

As used herein the term polyene and the term polyyne refer to single or complex species of alkenes or alkynes, liquid at or below 70°C, having a multiplicity of terminal reactive carbon-to-carbon unsaturated functional groups per average molecule. For example, a diene is a polyene that has two reactive carbon-to-carbon double bonds per average molecule, while a diyne is a polyyne that contains in its structure two reactive carbon-to-carbon triple bonds per average molecule. Combinations of reactive double bonds and reactive triple bonds within the same molecule are also possible such as for monovinylacetylene which is a polyeneyne under this definition. For purposes of brevity all these classes of compounds are referred to herein as polyenes.

The term "functionality" as used herein refers to the average number of ene (or yne) or thiol groups per molecule in the polyene or polythiol, respectively. For example, a triene is a polyene with an average of three "reactive" carbon-to-carbon unsaturated groups per molecule and thus has a functionality of three. A dithiol is a polythiol with two thiol groups per molecule and thus has a functionality of two. A trithiol has a functionality of three, and a tetrathiol has a functionality of four. A diene has a functionality of two, and a tetraene a functionality of four.

It is to be understood that the functionality of the polyene and the polythiol component is commonly expressed in whole numbers although in practice the actual functionality may be fractional. For example, a polyene component having a nominal functionality of two (from theoretical considerations alone) may in fact have an effective functionality of somewhat less than two. In an attempted synthesis of a diene from a glycol in which the reaction proceeds to 100 percent of the theoretical value for complete reaction, the functionality (assuming 100 percent pure starting materials) would be 2.0. If, however, the reaction were carried to only 90 percent of theory for complete reaction, about 10 percent of the molecules present would have only one ene functional group, and there may be a trace of material that would have no ene functional groups at all. Approximately 90 percent of the molecules, however, would have the desired diene structure and the product as a whole then would have an actual functionality of 1.9. Such a product is useful in the instant invention and is referred to herein as having a functionality of two.

The term reactive unsaturated carbon-to-carbon groups means groups which will react under proper conditions as set forth herein with thiol groups to yield the thioether linkage $$-\overset{|}{\underset{|}{C}}-S-\overset{|}{\underset{|}{C}}-$$

as contrasted to the term unreactive carbon-to-carbon unsaturation which means $$-\overset{|}{C}=\overset{|}{C}-$$

groups found in aromatic nuclei (cyclic structures exemplified by benzene, pyridine, anthracene, and the like) which do not under the same conditions react with thiols to give thioether linkages.

The term "equivalent" as applied to a polythiol means that quantity of the polythiol which contains 33.07 grams of —SH group. Thus, an equivalent of pentaerythritol tetra-beta-mercaptopropionate is one-fourth mole of said mercaptopropionate because each molecule of said mercaptopropionate contains four —SH groups (i.e., a mole of this compound contains 132,28 grams of —SH).

In a polythiol compound having the formula $$R_{10}\left(-O\overset{O}{\overset{\|}{C}}-R_9-SH\right)_n$$

an equivalent is one-half mole where n is 2; one-third mole where n is 3, one-fourth mole where n is 4, and one-fifth mole where n is 5. As noted supra the term "reactive olefinically or ethylenically unsaturated group" means a group (having olefinic or acetylinic carbon-to-carbon unsaturation) which will react under proper conditions as set forth herein with thiol groups to yield a thioether linkage $$\left(-\overset{|}{\underset{|}{C}}-S-\overset{|}{\underset{|}{C}}-\right),$$

as contrasted to the term "unreactive carbon-to-carbon unsaturation" which means $$-\overset{|}{C}=\overset{|}{C}-$$

groups found in aromatic nucleii (cyclic structures exemplified by benzene, pyridine, anthracene, and the like) which do not under the same conditions react with thiols to give thioether linkages.

The term "equivalent" as applied to a compound having reactive olefinic or acetylenic unsaturation means that quantity of the compound which contains one reactive olefinic double bond or one reactive acetylenic triple bond. Thus, if a compound contains two such bonds an equivalent of said compound is one-half mole of said compound, while an equivalent of a compound containing three such bonds is one-third mole, and an equivalent of a compound containing four such bonds is one-fourth mole.

As used herein, the term "percent" means parts per hundred and the term "parts" means parts by weight unless otherwise defined where used.

As used herein, the term "mole" has its generally accepted meaning, that is, a mole of a substance is that quantity of the substance which contains the same number of molecules of the substance as there are atoms of carbon in 12 grams of pure $^{12}C$.

As used herein, the term "g." means gram or grams.

As used herein, the term "A" means Angstrom units.

As used herein, the term "cps" means centipoises.

As used herein, the term "M.W." means molecular weight.

As used herein, the term "mil" means 0.001 inch and the term "mils" is the plural form of "mil".

I claim:

1. An apparatus useful for preparing a photoinsolubilized photocured printing plate from a plate comprising a support layer and a photocurable composition coated on and supported by the support layer, the apparatus comprising:

a. a laser adapted to generated a beam of actinic laser radiation;

b. a modulator positioned to receive and modulate the beam of actinic laser radiation;

c. a means for orienting the modulated beam of actinic laser radiation positioned to receive and orient the modulated beam of actinic laser radiation, the means for orienting the modulated beam of actinic laser radiation comprising a vertical sweep deflector and a horizontal sweep deflector;
d. a means for focusing the oriented and modulated beam of actinic laser radiation positioned to receive the oriented and modulated beam of actinic laser radiation and focus it on the predetermined plane;
e. a partially reflecting mirror interposed between the means for focusing the oriented and modulated beam of actinic laser radiation and the predetermined plane positioned to divide the focused, oriented, and modulated beam of actinic laser radiation into;
  i. a major beam of focused, oriented, and modulated actinic laser radiation focused on the predetermined plane; and
  ii. a minor beam of oriented and modulated actinic laser radiation deflected from the path of the major focused, oriented, and modulated beam of actinic laser radiation;
f. a first support positioned to hold the plate comprising the photocurable composition and the support layer with the photocurable composition in the predetermined plane;
g. a second support positioned to hole a first transparency in and substantially perpendicular to the path of the minor beam of oriented and modulated actinic laser radiation so that the minor beam of oriented and modulated actinic laser radiation can pass through transparent portions of the transparency;
h. a photomultiplier tube positioned to receive the minor beam of oriented and modulated actinic laser radiation which has passed through the transparency and emit a first electrical signal in response to the minor beam of oriented and modulated actinic laser radiation which has passed through the transparency;
i. a first amplifier positioned to receive the first electrical signal from the photomultiplier tube and emit a second amplified electrical signal in response to the first electrical signal, the second amplified electrical signal passing to and controlling the modulator;
j. a master clock to emit a third electrical signal and a fourth electrical signal;
k. a vertical sweep generator positioned to receive the third electrical signal from the master clock and emit a fifth electrical signal in response to the third electrical signal;
l. a second amplifier positioned to receive the fifth electrical signal and emit a sixth amplified electrical signal in response to the fifth electrical signal, the sixth amplified electrical signal passing to and controlling the vertical sweep deflector;
m. a horizontal sweep generator positioned to receive the fourth electrical signal from the master clock and emit a seventh electrical signal in response to the fourth electrical signal;
n. a third amplifier positioned to receive the seventh electrical signal and emit an eighth amplified electrical signal in response to the seventh electrical signal, the eighth amplified electrical signal passing to and controlling the horizontal sweep deflector;

2. The apparatus of claim 1 in which a collimator and beam expander is positioned between the laser and the modulator to receive, collimate, and expand the beam of actinic radiation generated by the laser.

3. The apparatus of claim 1 in which a lens system is positioned to receive the minor beam of oriented and modulated actinic laser radiation which has passed through the transparency and focus it on the photomultiplier tube.

4. The apparatus of claim 1 in which the first amplifier is a video amplifier.

5. The apparatus of claim 1 in which the master clock emits a ninth electrical signal, the ninth electrical signal passing to and activating a means for transporting the first transparency and a second transparency to position the second transparency substantially perpendicular to the minor beam of oriented and modulated actinic laser radiation.

6. The apparatus of claim 1 in which the laser is an argon ion laser, a krypton ion laser, a helium cadmium laser, or a pulsed nitrogen laser.

7. A process for preparing a polymeric printing plate from a plate comprising a coating of a photocurable composition and a support layer, the photocurable composition being coated on and supported by the support layer, the printing plate having an image thereon corresponding to an image on a transparency, the process comprising:
a. generating a beam of actinic laser radiation having an intensity sufficient to cure the photocurable composition;
b. modulating the beam of actinic laser radiation in a controlled manner;
c. orienting the beam of modulated actinic laser radiation in a controlled manner;
d. focusing the beam of oriented and modulated actinic laser radiation on a predetermined plane;
e. dividing the beam of focused, oriented, and modulated actinic laser radiation into;
  i. a major beam of focused, oriented, and modulated actinic laser radiation, the major beam of focused, oriented, and modulated actinic laser radiation being focused on the coating of photocurable composition positioned in the predetermined plane to cure exposed portions of the photocurable composition; and
  ii. a minor beam of oriented and modulated actinic laser radiation, the minor beam of oriented and modulated laser radiation being deflected from the path of the major beam of focused, oriented, and modulated actinic laser radiation;
f. passing the minor beam of oriented and modulated actinic laser radiation through transparent portions of the transparency;
g. converting the minor beam of oriented and modulated actinic laser radiation which has passed through the transparency into a first electrical signal;
h. amplifying the first electrical signal to produce a second amplified electric signal and passing the second amplified signal to a modulator to control the modulator, the modulator controlling modulation of the beam of actinic laser radiation;
i. passing a third electrical signal from a master clock to a vertical sweep generator, the third electrical signal controlling the vertical sweep generator and causing the vertical sweep generator to emit a fourth electrical signal;

j. amplifying the fourth electrical signal and passing the resulting fifth amplified electrical signal to a vertical sweep deflector to control the vertical sweep deflector, the vertical sweep deflector controlling a vertical sweep pattern of the beam of modulated actinic laser radiation;

k. passing a sixth electrical signal from the master clock to a horizontal sweep generator, the sixth electrical signal controlling the horizontal sweep generator and causing the horizontal sweep generator to emit a seventh electrical signal;

l. amplifying the seventh electrical signal and passing the resulting eighth amplified electrical signal to a horizontal sweep deflector to control the horizontal sweep deflector, the horizontal sweep deflector controlling a horizontal sweep pattern of the beam of modulated actinic laser radiation; and m. removing uncured portions of the photocurable composition from the support layer, and leaving the cured portions of the photocurable composition adhering to the support layer.

8. The process of claim 7 in which the beam of actinic laser radiation is collimated and expanded before being modulated.

9. The process of claim 7 in the laser beam has a wave length of 3,000–4,000A.

10. The process of claim 7 in which a photomultiplier tube is used to convert the minor beam of oriented and modulated actinic laser radiation which has passed through the transparency into the first electric signal.

11. An apparatus useful for preparing a photoinsolubilized photocured printing plate from a plate comprising a support layer and a photocurable composition coated on and supported by the support layer, the apparatus comprising:

a. a laser to generate a beam of actinic laser radiation;

b. a modulator positioned to receive and modulate the beam of actinic laser radiation;

c. a means for orienting the modulated beam of actinic laser radiation positioned to receive and orient the modulated beam of actinic laser radiation, the means for orienting the modulated beam of actinic laser radiation comprising a vertical sweep deflector and a horizontal sweep deflector;

d. a first means for focusing the oriented and modulated beam of actinic laser radiation positioned to receive the oriented and modulated beam of actinic laser radiation and focus it on a first predetermined plane;

e. a partially reflecting mirror interposed between the means for focusing the oriented and modulated beam of actinic laser radiation and the first predetermined plane positioned to divide the focused, oriented, and modulated beam of actinic laser radiation into;

i. a major beam of focused oriented and modulated actinic laser radiation focused on the first predetermined plane; and ii. a minor beam of oriented and modulated actinic laser radiation deflected from the path of the major focused, oriented, and modulated beam of actinic laser radiation;

f. a first support positioned to hold the plate comprising the photocurable composition and the support layer with the photocurable composition in the first predetermined plane;

g. a second support positioned to hold a document to be reproduced in and substantially perpendicular to the path of the minor beam of oriented and modulated actinic laser radiation so that the minor beam of oriented and modulated actinic laser radiation can impinge on and be reflected from the surface of the document to be reproduced;

h. a second means for focusing the reflected minor beam of oriented and modulated actinic laser radiation on a second predetermined plane;

i. a photomultiplier tube positioned in the second predetermined plane to receive the reflected minor beam of focused, oriented, and modulated actinic laser radiation and emit a first electrical signal in response to the beam of reflected, focused, oriented, and modulated actinic laser radiation;

j. a first amplifier positioned to receive the first electrical signal from the photomultiplier tube and emit a second amplified electric signal in response to the first electric signal, the second amplified electrical signal passing to and controlling the modulator;

k. a master clock to emit a third electrical signal and a fourth electrical signal;

l. a vertical sweep generator positioned to receive the third electrical signal from the master clock and emit a fifth electrical signal in response to the third electrical signal;

m. a second amplifier positioned to receive the fifth electrical signal and emit a sixth amplified electrical signal in response to the fifth electrical signal, the sixth amplified electrical signal passing to and controlling the vertical sweep deflector;

n. a horizontal sweep generator positioned to receive the fourth electrical signal and emit a seventh electrical signal in response to the fourth electrical signal;

o. a third amplifier positioned to receive the seventh electrical signal and emit an eighth amplified electrical signal in response to the seventh electrical signal, the eighth amplified electrical signal passing to and controlling the horizontal sweep generator.

12. The apparatus of claim 11 in which a collimator and beam expander is positioned between the laser and the modulator to receive, collimate, and expand the beam of actinic radiation generated by the laser.

13. The apparatus of claim 11 in which the first amplifier is a video amplifier.

14. The apparatus of claim 11 in which the second and third amplifiers are video amplifiers.

15. The apparatus of claim 11 in which the laser is an argon ion laser, a krypton ion laser, a pulsed nitrogen laser, or a helium cadmium laser.

16. A process for preparing a polymeric printing plate from a plate comprising a coating of a photocurable composition and a support layer, the photocurable composition being coated on and supported by the support layer, the printing plate having an image thereon corresponding to an image on a document, the process comprising;

a. generating a beam of actinic laser radiation having an intensity sufficient to cure the photocurable composition;

b. modulating the beam of actinic laser radiation in a controlled manner;
c. orienting the beam of modulated actinic laser radiation in a controlled manner;
d. focusing the beam of oriented and modulated actinic laser radiation on a predetermined plane;
e. dividing the beam of focused, oriented, and modulated actinic laser radiation into;
 i. a major beam of focused, oriented, and modulated actinic laser radiation, the major beam of focused, oriented, and modulated actinic laser radiation being focused on the coating of photocurable composition positioned in the predetermined plane to cure exposed portions of the photocurable composition; and
 ii. a minor beam of oriented and modulated actinic laser radiation, the minor beam of oriented and modulated laser radiation being deflected from the path of major beam of focused, oriented, and modulated actinic laser radiation;
f. impinging the minor beam of oriented and modulated actinic laser radiation on the surface of the document and reflecting the minor beam of oriented and modulated actinic laser radiation from the surface;
g. converting the minor beam of oriented and modulated actinic laser radiation reflected from the document into a first electrical signal;
h. amplifying the first electrical signal to produce a second amplified electric signal and passing the second amplified signal to a modulator to control the modulator, the modulator controlling modulation of the beam of actinic laser radiation;
i. passing a third electrical signal from a master clock to a vertical sweep generator, the third electrical signal controlling the vertical sweep generator and causing the vertical sweep generator to emit a fourth electrical signal;
j. amplifying the fourth electrical signal and passing the resulting fifth amplified electrical signal to a vertical sweep deflector to control the vertical sweep deflector, the vertical sweep deflector controlling a vertical sweep pattern of the beam of modulated actinic laser radiation;
k. passing a sixth electrical signal from the master clock to a horizontal sweep generator, the sixth electrical signal controlling the horizontal sweep generator and causing the horizontal sweep generator to emit a seventh electrical signal;
l. amplifying the seventh electrical signal and passing the resulting eighth amplified electrical signal to a horizontal sweep deflector to control the horizontal sweep deflector, the horizontal sweep deflector controlling a horizontal sweep pattern of the beam of modulated actinic laser radiation; and
m. removing uncured portions of the photocurable composition from the support layer, and leaving the cured portions of the photocurable composition adhering to the support layer.

17. The process of claim 16 in which the beam of actinic laser radiation is collimated and expanded before being modulated.

18. The process of claim 16 in the laser beam has a wave length of 3,000–4,000A.

19. A process for preparing a polymeric printing plate from a plate comprising a coating of a photocurable composition and a support layer, the photocurable composition being coated on and supported by the support layer, the printing plate having an image thereon corresponding to an image on a document, the process comprising:

a. generating a beam of actinic laser radiation having an intensity sufficient to cure the photocurable composition;
b. modulating the beam of actinic laser radiation in a controlled manner;
c. orienting the beam of modulated actinic laser radiation in a controlled manner;
d. focusing the beam of oriented and modulated actinic laser radiation on the coating of photocurable composition to cure exposed portions of the photocurable composition;
e. using a television vidicon tube to convert the image on the document into a first electrical signal;
f. amplifying the first electrical signal to produce a second amplified electric signal and passing the second amplified signal to a modulator to control the modulator, the modulator controlling modulation of the beam of actinic laser radiation,
g. passing a third electrical signal from a master clock to a vertical sweep generator, the third electrical signal controlling the vertical sweep generator and causing the vertical sweep generator to emit a fourth electrical signal;
h. amplifying the fourth electrical signal and passing the resulting fifth amplified electrical signal to a vertical sweep deflector to control the vertical sweep deflector, the vertical sweep deflector controlling a vertical sweep pattern of the beam of modulated actinic laser radiation;
i. passing a sixth electrical signal from the master clock to a horizontal sweep generator, the sixth electrical signal controlling the horizontal sweep generator and causing the horizontal sweep generator to emit a seventh electrical signal;
j. amplifying the seventh electrical signal and passing the resulting eighth amplified electrical signal to a horizontal sweep deflector to control the horizontal sweep deflector, the horizontal sweep deflector controlling a horizontal sweep pattern of the beam of modulated actinic laser radiation; and
k. removing uncured portions of the photocurable composition from the support layer, and leaving the cured portions of the photocurable composition adhering to the support layer.

20. The process of claim 19 in which the beam of actinic laser radiation is collimated and expanded before being modulated.

21. The process of claim 19 in the laser beam has a wave length of 3,000–4,000A.

22. A process for preparing a photocured image on a support layer from a coating of a photocurable composition on the support layer, the process comprising:

a. generating a beam of actinic laser radiation having an intensity sufficient to cure the photocurable composition;
b. modulating the beam of actinic laser radiation in a controlled manner;
c. orienting the beam of modulated actinic laser radiation in a controlled manner;
d. focusing the beam of oriented and modulated actinic laser radiation on a predetermined plane;

e. dividing the beam of focused, oriented, and modulated actinic laser radiation into;

i. a major beam of focused, oriented, and modulated actinic laser radiation, the major beam of focused, oriented, and modulated actinic laser radiation being focused on the coating of photocurable composition positioned in the predetermined plane to cure exposed portions of the photocurable composition; and ii. a minor beam of oriented and modulated actinic laser radiation, the minor beam of oriented and modulated laser radiation being deflected from the path of major beam of focused, oriented, and modulated actinic laser radiation;

f. impinging the minor beam of oriented and modulated actinic laser radiation on the surface of the document and reflecting the minor beam of oriented and modulated actinic laser radiation from the surface;

g. converting the minor beam of oriented and modulated actinic laser radiation reflected from the document into a first electrical signal;

h. amplifying the first electrical signal to produce a second amplified electric signal and passing the second amplified signal to a modulator to control the modulator, the modulator controlling modulation of the beam of actinic laser radiation;

i. passing a third electrical signal from a master clock to a vertical sweep generator, the third electrical signal controlling the vertical sweep generator and causing the vertical sweep generator to emit a fourth electrical signal;

j. amplifying the fourth electrical signal and passing the resulting fifth amplified electrical signal to a vertical sweep deflector to control the vertical sweep deflector, the vertical sweep deflector controlling a vertical sweep pattern of the beam of modulated actinic laser radiation;

k. passing a sixth electrical signal from the master clock to a horizontal sweep generator, the sixth electrical signal controlling the horizontal sweep generator and causing the horizontal sweep generator to emit a seventh electrical signal;

l. amplifying the seventh electrical signal and passing the resulting eighth amplified electrical signal to a horizontal sweep deflector to control the horizontal sweep deflector, the horizontal sweep deflector controlling a horizontal sweep pattern of the beam of modulated actinic laser radiation; and m. removing uncured portions of the photocurable composition from the support layer and leaving the cured portions of the photocurable composition adhering to the support layer to form the photocured image adhering to the support layer.

* * * * *

Disclaimer 3,836,709.—*John Grear Hutchinson*, Catonsville, Md. PROCESS AND APPARATUS FOR PREPARING PRINTING PLATES USING A PHOTOCURED IMAGE. Patent dated Sept. 17, 1974. Disclaimer filed Mar. 4, 1975, by the assignee, *W. R. Grace & Co.*

Hereby enters this disclaimer to claims 1 through 18 and 22 of said patent.

[*Official Gazette July 22, 1975.*]